US006803598B1

(12) United States Patent
Berger et al.

(10) Patent No.: US 6,803,598 B1
(45) Date of Patent: Oct. 12, 2004

(54) SI-BASED RESONANT INTERBAND TUNNELING DIODES AND METHOD OF MAKING INTERBAND TUNNELING DIODES

(75) Inventors: Paul R. Berger, Newark, DE (US); Phillip E. Thompson, Springfield, VA (US); Roger Lake, Dallas, TX (US); Karl Hobart, Upper Marlboro, MD (US); Sean L. Rommel, Champaign, IL (US)

(73) Assignee: University of Delaware, Newark, DE (US)

( * ) Notice: Subject to any disclaimer, the term of this patent is extended or adjusted under 35 U.S.C. 154(b) by 0 days.

(21) Appl. No.: 09/565,455

(22) Filed: May 5, 2000

Related U.S. Application Data

(60) Provisional application No. 60/133,067, filed on May 7, 1999.

(51) Int. Cl.[7] .................. H01L 29/06; H01L 29/861; H01L 21/8222
(52) U.S. Cl. ............... 257/25; 257/14; 257/17; 257/22; 257/23; 257/104; 257/106; 438/330; 438/979; 438/983
(58) Field of Search .................. 257/14, 17, 22, 257/23, 25, 104, 106; 438/330, 979, 983, 380

(56) References Cited

U.S. PATENT DOCUMENTS 5,606,177 A * 2/1997 Wallace et al. ............... 257/25
5,659,180 A * 8/1997 Shen et al. .................... 257/25
6,204,513 B1 * 3/2001 El-Zein et al. ................ 257/14

OTHER PUBLICATIONS

Sean L. Rommel et al., "Room Temperature operation of epitaxial grown Si/Si0.5Ge0.5/Si resonant interband tunneling diodes", Applied Physics Lett., vol. 73, No. 15, pp 2191–2193, Oct. 12, 1998.*
H.H. Tsai et al., "P–N Double Quantum Well Resonant Interband Tunneling Diode with Peak–to–Valley Current Ratio of 144 at Room Temperature", IEEE Electron Device Lett., vol. 15, No. 9, pp 357–359, Sep. 1994.*
M. Sweeny et al., "Resonant interband tunnel diodes", Appl. Phys. Lett., vol. 54, No. 6, pp 546–548, Feb. 6, 1989.*
H. J. Gossmann et al, "Delta Doping in Silicon", Critical Reviews in Solid State and Materials Sciences, 18(1) : 1–67 (1993).
G. E. Becker et al, "Recptor Dopants in Silicon Molecular–Beam Epitaxy", Journal of Applied Physics, vol. 48, No. 8, Aug., 1977.

(List continued on next page.)

*Primary Examiner*—Donghee Kang
(74) *Attorney, Agent, or Firm*—Birch, Stewart, Kolasch & Birch, LLP

(57) ABSTRACT

Interband tunnel diodes which are compatible with Si-based processes such as, but not limited to, CMOS and SiGe HBT fabrication. Interband tunnel diodes are disclosed (i) with spacer layers surrounding a tunnel barrier; (ii) with a quantum well adjacent to, but not necessarily in contact with, one of the injectors, and (iii) with a first quantum well adjacent to, but not necessarily in contact with, the bottom injector and a second quantum well adjacent to, but not necessarily in contact with, the top injector. Process parameters include temperature process for growth, deposition or conversion of the tunnel diode and subsequent thermal cycling which to improve device benchmarks such as peak current density and the peak-to-valley current ratio.

53 Claims, 22 Drawing Sheets

OTHER PUBLICATIONS

J. Knall et al, "Indium Incorporation During the Growth of (100) Si by Molecular Beam Epitaxy: Surface Segregation & Reconstruction", Applied Physics Letters 45 (6), Sep. 15, 1984.

T. E. Jackman et al, "Annealing Studies of Highly Doped Boron Superlattices", J. Applied Physics, 66 (5), Sep. 1, 1989.

S. A. Barnett et al, "Si Molecular Beam Epitaxy: A Model for Temperature Dependent Incorporation Probabilities and Depth Distributions of Dopants Exhibiting Strong Surface Segregation", Depts. Metallurgy, Coordinated Sci. Lab. & Materials Research Lab, Oct. 15, 1984.

K. Morita et al, "Supply Voltage by a Novel Si Interband Tunneling Diode", Central Research Lab, pp. 42–43.

K. Morita et al, "Si Interband Tunneling Diode Through a Thin Oxide with a Degenerate Poly–Si Electrode", Central Research Lab, pp. 175–176, Nov. 5–7, 1997.

K. D. Hobart et al, "Surface Segregation and Structure of Sb–Doped Si (100) Films Grown at Low Temperature by Molecular Beam Epitaxy", Surface Science 334 (1995) 29–38.

K. D. Hobart et al, "Surface Segregation of Arsenic & Phosphorus From Buried Layers During Si Molecular Beam Epitaxy", J. Vac. Sci. Tencnol. B 14 (3), May/Jun. 1996.

S. S. Iyer et al, "Sharp Profiles with High and Low doping Levels in Silicon Grown by Molecular Beam Epitaxy", J. Appl. Phys. 52 (9), Sep. 1981.

J. P Noel et al, "Photoluminescence Studies of Si (100) Doped with Low–Energy (100–1000 eV) B+IONS During Molecular Beam Epitaxy", Applied Phys. Letters, vol. 56, No. 3, Jan. 15, 1990.

K. D. Hobart et al, "SB Surface Segregation During Heavy Doping of Si (100) Grown at Low Temperature by Molecular Beam Epitaxy", J. Vac. Sci. Technol. B 11 (3), MAy/Jun. 1993

S. Fukatsu et al, "Self–Limitation in the Surface Segregation of Ge Atoms During Si Molecular Beam Epitaxial Growth", Appl. Phys. Lett., vol. 59, No. 17, Oct. 21, 1991.

Yasuhiro Shiraki, "Silicon Molecular Beam Deposition", Central Research Laboratory, Japan, pp. 345–370.

D. J. Eaglesham et al, "Limiting Thickness h$_{epi}$ for Epitaxial Growth and Room–Temperature Si Growth on Si (100)", Physical Review Letters, vol. 65, No. 10, Sep. 3, 1990.

Paul R. Berger et al, "Comparative Study of the Growth Processes of GaAs, AlGaAs, InGaAs, and InAlAs Lattice Matched and Nonlattice Matched Semiconductors Using High–Energy Electron Diffraction", J.Appl. Phys. 61 (8), Apr. 15, 1987.

Paul R. Berger et al, "Role of Strain and Growth Conditions on the Growth Front Profile of In$_x$Ga$_{1-x}$As on GaAs During the Pseudomorphic Growth Regime", Appl. Phys. Lett. 53 (8), Aug. 22, 1998.

H. J. Gossman et al, "Dopant Electrical Activity and Majority–Carrier Mobility In B– and Sb– ∂–Doped Si Thin Films", Phys. Rev.B, vol. 47, Num. 19, May 15, 1993.

Guido Masetti et al, "Modeling of Carrier Mobility Against Carrier Concentration In Arsenic–, Phosporus–, and Boron– Doped Silicon", IEEE Transactions on Electron Devices, vol. Ed–30, No. 7, Jul. 1983.

P. Asoka–Kumar et al, "Distribution of Point Defects In Si (100) / Si Grown by Low–Temperature Molecular–Beam Epitaxy and Solid–Phase Epitaxy", Physical Review B, vol. 48, No. 8, Aug. 15, 1993.

H. Jorke et al, "Forward–Bias Characteristics of Si Bipolar Junctions Grown by Molecular Beam Epitaxy at Low Temperatures", Appl. Phys. Lett., vol. 63, No. 17, Oct. 25, 1993.

G. Reitmann et al, "Tunnelling Currents In Very Narrow p +0 –n+ Junctions", Thin Solid Films 336 (1998), pps. 344–346.

Wang YH et al, "Resonant Tunneling Diode in MBE–Grown Delta–Doped GaAs", Abstract, Electronic Letters, Aug. 29, 1991.

Wang YH et al, "Homotype Resonant Tunneling Structures in Molecular–Beam Epitaxially Grown Delta–Dopes GaAs", Journal of Vacuum Science & Technology B, Mar.–Apr. 1992.

A. Seabaugh et al, "Transistors and Tunneel Diodes for Analog/Mixed–Signal Circuits and Embedded Memory", Raytheon Systems Company.

J. Shen et al, "Static Random Access Memories Based on Resonant Interband Tunneling Diodes in the InAs/GaSb/ AlSb Material System", IEE Electron Device Letters, vol. 16, No. 5, May 1995.

J.P.A. Van der Wagt et al, "RTD/HFET Low Standby Power SRAM Gain Cell", IEEE Electron Device Letters, vol. 19, No. 1, Jan. 1998.

V. M. Franks et al, "An Alloy Process for Making High Current Density Silicon Tunnel Diode Junctions", Solid– State Electronics, vol. 8–pps. 343–344, Oct. 5, 1964.

R. Duschl et al, "High Room Temperature Peak–to–Valley Current Ratio in Si Based Esaki Diodes", Electronics Letters, vol. 35, No. 13, Jun. 24, 1999.

R. Duschl et al, "Epitaxially Grown Si/SiGe Interband Tunneling Diodes with High Room–Temperature Peak– to–Valley Ratio", Applied Physics Letters, vol. 76, No. 7, Feb. 14, 2000.

R. Tsu et al, "Tunneling in a Finite Superlattice", Applied Physics Letters, vol. 22, No. 11, Jun. 1973.

L. L. Chang et al, "Resonant Tunneling in Semiconductor Double Barries", Applied Physics Letters, vol. 24, No. 12, Jun. 15, 1974.

Ulf Gennser et al, "Resonant Tunneling of Holes Through Silicon Barriers", J. Vac. Sci. Technol. B, vol. 8, No. 2, Mar./Apr. 1990.

K. Ismail et al, "Electron Resonant Tunneling in Si/SiGe Double Barrier Diodes", Applied Physics Letters, 59, (8), Aug. 19, 1991.

Mark, Sweeny et al, "Resonant Interband Tunnel Diodes", Applied Physics Letters, 54 (6), Feb. 6, 1989.

H. H. Tsai et al, "P–N Double Quantum Well Resonant Interband Tunneling Diode with Peak–to–Valley Current Ratio of 144 at Room Temperature", IEEE Electron Device Letters, vol. 15, No. 9, Sep., 1994.

D. J. Day et al, "Experimental Demonstration of Resonant Interband Tunnel Diode with Room Temperature Peak– to–Valley Current Ratio Over 100", J. Appl. Phys. 73, (3), Feb. 1, 1993.

C. C. Yang et al, "The Study of GaAs/In: GaAs ∂–Doping Resonant Interband Tunneling Diode", Materials Science and Engineering B35 (1995) 259–262.

X. Zhu et al, "A Si Bistable Diode Utilizing Interband Tunneling Junctions", Appl. Phys. Lett. 71 (15), Oct. 13, 1997.

Xuegen Zhu et al, "Bistable Diodes Grown by Silicon Molecular Beam Epitaxy", Thin Solid Films 321 (1998) ppgs. 201–205.

Sean L. Rommel et al, "Room Temperature Operation of Epitaxially Grown Si/Si$_{0.5}$Ge$_{0.5}$/Si Resonant Interband Tunneling Diodes", Appl. Phys. Letts. vol. 73, No. 15, Oct. 12, 1998.

S. Rommel et al, "Si–Based Interband Tunneling Devices for High–Speed Logic and Low Power Memory Applications", Univ. of Delaware, Dept. of Electrical & Computer Engineering; Raytheon Systems and Naval Research Laboratory.

S. Rommel et al, "Epitaxially Grown Si Resonant Interband Tunnel Diodes Exhibiting High Current Densities", IEEE Electron Device Letters, vol. 20, No. 7, Jul. 1999.

P. Thompson et al, "Si Resonant Interband Tunnel Diodes Grown by Low–Temperature Molecular–Beam Epitaxy", App. Phys. Lett., vol. 75, No. 9, Aug. 30, 1999.

M. W. Dashiell et al, "Current–Voltage Characteristics of High Current Density Silicon Esaki Diodes Grown by Molecular Beam Epitaxy and the Influence of Thermal Annealing", IEEE Transactions on Electron Devices, vol. 47, No. 9, 9/00.

Paul R. Berger, "Current Status of Si–Based Tunnell Diodes", University of Delaware, Naval Research Laboratory, Dec. 9, 1999.

P. E. Thompson et al, "Epitaxial Si–Based Tunnel Diodes", Naval Research Lab; Dept. of Elec. & Comput. Engineering; Applied Research Lab; Dept. of Electrical Engineer.; National Inst. of Standards & Technology.

Paul R. Berger et al, "Comparative Study of the Growth Processes of GaAs AlGaAs, InGaAs, and InAlAs Lattice Matched & Nonlattice Matched Semiconductors Using High–Energy Electron Diffraction", J. Appl. Phys. 61 (8), Apr. 15, 1987.

F–Y. Juang et al, "Dietermination of the Microscopic Quality of InGaAs–InAlAs Interfaces by Photoluminescence–Role of Interrupted Molecular Beam Epitaxial Growth", App. Phys. Lett. 48 (4), Jan. 27, 1986.

P. Kringhøj et al. "Diffusion of Sb in Strained and Relaxed Si and SiGe", Physical Review Letters. vol. 76, No. 18, Apr. 29, 1996.

E. Wolak et al, "Elastic Scattering Centers in Resonant Tunneling Diodes", App. Phys. Letters 53 (3), Jul. 18, 1988.

K. D. Hobart et al, "A "p–on–n" Si Interband Tunnel Diode Grown by Molecular Beam Epitaxy", Naval Research Laboratory; Dept. of Electrical Engineering, U. of Delaware.

A. N. Larsen et al, "Diffusion of Sb in Relaxed Si$_{1-x}$Ge$_x$", App. Phys. Lett. 68 (19), May 6, 1996.

P. Kuo et al, "Effects of Strain on Boron Diffusion in Si and Si$_{1-x}$Ge$_x$", Stanford University and Hewlett–Packard, Dec. 1, 1994.

W. Gao et al, "In$_{0.53}$Ga$_{0.47}$As MSM Photodiodes with Transparent CTO Schottky Contacts and Digital Superlattice Grading", IEEE Transactions on Electron Devices, vol. 44, No. 12, Dec. 1997.

S. Rommel et al, "Development of $\partial$B/I–Si/$\partial$Sb and $\partial$B/iSi/$\partial$Sb/i–Si/$\partial$B Resonant Interband Tunnel Diodes for Integrated Circuit Applications", Naval Research Laboratory; Raytheon Systems.

* cited by examiner

- Four combinations of L1 and L2 were examined:
  - L1 = 5nm, L2= 9nm;
  - L1 = 5nm, L2=3nm;
  - L1=2 nm, L2=3 nm;
  - L1=2, L2=6 nm.

SI-BASED RESONANT INTERBAND TUNNELING DIODES AND METHOD OF MAKING INTERBAND TUNNELING DIODES

This application claims benefit of provisional application 60/133,067 filed May 7, 1999.

BACKGROUND OF THE INVENTION

The present application has Government rights assigned to the National Science Foundation under contract numbers ECS-9622134 and ECS-9624160, and assigned to DARPA/AFOSR under contract number F49620-96-C-0006.

A. Field of the Invention

The present invention relates generally to interband tunneling diodes, and, more particularly to Si-based resonant interband tunneling diodes and a method of making interband tunneling diodes.

B. Description of the Related Art

The purpose of this invention is the development of a tunnel diode exhibiting negative differential resistance (NDR) at room temperature on a Si platform. It has been demonstrated that tunnel diode/transistor logic, realized to date only in III–V material systems, enhances any transistor technology [1,2] by reducing the number of components per circuit function, increasing speed, and lowering power consumption. As an example of how tunnel diodes are beneficial, a tunneling static random access memory (T-SRAM) [3,4] exhibits reduced power consumption with a concurrent area reduction as compared to conventional static random access memory (SRAM) or dynamic random access memory (DRAM) cells. Depending on the circuit considered, one of three different performance gains or a combination thereof may be expected: (i) increased circuit speed, (ii) reduced circuit component counts/footprint areas, or (iii) reduced power dissipation.

With the exception of Si Esaki diodes fabricated by alloying during the 1960's, there have been very few reports of Si tunneling structures since that time. The Esaki diodes were studied extensively until the mid-1960's, setting a PVCR standard of 3.8 [5] which was only recently surpassed by Duschl et al. [6–7].

Advances in non-equilibrium epitaxial processing techniques such as molecular beam epitaxy (MBE) in the 1970's lead to the development of III–V-based resonant tunneling diodes (RTD) [8,9], establishing a renewed interest for augmenting existing circuitry with tunnel diodes. Tunneling in an RTD occurs when the energy of electrons at the electrode coincides with the energy level of confined states in a quantum well such that energy and momentum are conserved. This condition is known as resonance.

However, an n-type RTD is not particularly feasible to build in Si. A number of groups in the early 1990's investigated Si/SiGe RTDs based on hole transport, but the results were marginal [10,11] at room temperature. Ismail et al. attempted to circumvent this problem by growing the tunnel diodes on a relaxed SiGe layer [12]. This valiant attempt to develop a working RTD, however, only produced a PVCR of only 1.2 at room temperature.

In the late 1980's the resonant interband tunnel diode (RITD), a hybrid between Esaki diodes and RTDs, was first proposed by Sweeny and Xu [13]. The standard RITD is a bipolar device with quantum wells defined on opposite sides of a tunnel barrier in both the p and n type regions. As the device is forward biased, the electron states in the n-side quantum well and hole states in the p side quantum well are in resonance, and the current increases. As the device is biased beyond the peak voltage, the states are no longer in resonance, and NDR will occur. If the wells are deep enough to allow for multiple states, it is theoretically possible to observe the presence of a weak second NDR region. As with the Esaki diode, once the device is biased beyond the built-in potential, the current will increase due to the onset of diffusion current. Also, for a standard double quantum well p-n RITD, NDR will only be observed under forward bias.

Sweeny and Xu suggested a number of methods for defining quantum wells in an RITD [13]. One type of device uses narrow gap materials to define a type I heterojunction double quantum well. Reports of double quantum well RITDs using InAlAs/InGaAs have demonstrated PVCRs as high as 144, the highest of any existing tunnel diode technology to date [14]. A second device uses type II heterojunctions to define the quantum well. One example of this structure is an InAs/AlSb/GaSb RITD. Since the conduction band of InAs lies below the valence band of GaSb, quantum wells may be formed without high doping. Carriers would then tunnel from confined states between the InAs/InSb conduction band well. The use of a double barrier has been shown to enhance the PVCR [14,15] experimentally.

A third device, which is essentially a hybrid between an Esaki diode and an RTD, incorporates δ-doping planes on either side of the p-n junction to define the quantum states for the majority carrier. This device will be the template of choice for the experimental work in the invention. III–V RITDs incorporating this structure have demonstrated PVCRs as high as 5.0 [16].

To achieve δ-doping requires careful control of surface segregation and interdiffusion effects to exceed the solid solubility limit of many dopants. Surface segregation is a phenomenon that occurs when the number of impurities arriving at the substrate during growth exceed the equilibrium solid solubility at the surface leading to a buildup of impurities on the growth surface. Doping in Si-MBE at growth temperatures greater than 450° C. is well known to suffer from surface segregation [17]. A number of studies in the 1980s/1990s have demonstrated the occurrence of this phenomenon in Si for common p-type dopants (Ga [18], In [19], and B [20]) as well as for the n-type dopant Sb [21]. A region of doping impurities contained within a two dimensional plane of the epitaxial layer is known as a δ-doping plane of dopants.

Essentially, the growth of a δ-doping plane is nothing more than a stop growth. Schubert outlines the following 3 steps to the realization of a δ-doping layer [22]: (i) suspend epitaxial growth, (ii) allow a flux consisting only of dopants to impinge on the semiconductor surface, and (iii) resume growth of the epitaxial layer. In the idealized case where the sticking coefficient is nearly unity, and very little diffusion or segregation occurs, the dopants will be confined to the atomic plane.

In reality, the growth of a δ-doping layer is kinetically limited. Phenomena such as segregation and diffusion will result in undesirable broadening of the δ-doping planes. Schubert defines a true δ-doping plane to be a spike with a full width at half maximum less than 2.5 nm [22]. The key to achieving such a profile is suppressing segregation and diffusion by removing the energy required to make these phenomena favorable. The low temperature growth techniques described earlier were shown to do just this, and will therefore be useful for the realization of δ-doping planes. A possibility for controlling doping profiles is reducing segregation and diffusion, two kinetically mediated phenomena.

Since both segregation and diffusion rely on the substrate temperature, a possibility for suppressing these mechanisms is to reduce the growth temperature until neither mechanism is probable. Growth at reduced temperatures, however, will almost certainly produce films of increased defect densities.

The first approach to growing abrupt δ-doping profiles to show promise among the Si community was solid phase epitaxy (SPE). In SPE, growth takes place at room temperature. This leads to two results: monotonically abrupt doping profiles and an amorphous epitaxial layer. All segregation is suppressed, as is in-situ diffusion. A post growth anneal is performed to re-crystallize the layer. One problem with SPE is that electrical activity falls below unity, particularly for Sb [23]. This implies that some Sb species have clustered during growth into complexes that act as defect sites. Since the undesirable excess current component of tunnel diodes is believed to be defect mediated, highly defected growth is unacceptable for tunnel diode growth.

While low temperature molecular beam epitaxy (LT-MBE) will not allow for profiles as sharply defined as those formed by SPE, it is sufficient to substantially suppress dopant segregation. A study by Hobart et al. illustrates this point [24]. In this experiment, a monolayer of Sb was deposited on a Si surface at various substrate temperatures to study segregation. A 100 nm Si cap was then grown on top of the Sb at the same growth temperature as the Sb monolayer. In that study is shown the secondary ion mass spectrometry (SIMS) profiles which resulted. The evidence of segregation is clear at high growth temperatures as the Sb profile is asymmetrically broadened toward the surface. Consequently, the resulting height of the δ-doping spike is very low. The trend with lowered temperatures was two fold: both the doping height and abruptness improved substantially. Even the excellent results at 320° C., however, still suffer from moderate segregation.

Achieving sharp, arbitrary n-type doping profiles during Si and SiGe MBE is challenging and several approaches have been investigated to overcome the high surface segregation ratio of P, As, and Sb [25]. Such approaches include LT-MBE [24], "build-up" and "flash-off" [26], and in-situ ion implantation [27]. Each has its limitations and for the latter technique it is one primarily of cost and complexity. Low temperature epitaxy (LTE) is a simple technique where the low growth temperature kinetically limits surface segregation processes. Film quality is however compromised in return for achieving active Sb doping levels in excess of $5 \times 10^{20}$ cm$^{-3}$. LTE is most useful for producing low resistance contact layers since these layers are typically grown last in the layer sequence and do not jeopardize the integrity of preceding layers. Surface segregation of n-type dopants decreases significantly at low temperature but still exists and leads to a significant segregation "tail" following growth of the δ-doped layer. Build-up and flash-off techniques were employed in the infancy of Si MBE and as the terms simply involve building up certain coverage of dopant on the surface during a growth interruption, growing a given Si film thickness, and finally raising the substrate temperature to desorb the excess dopant. The technique indeed produces sharp doping profiles although the high temperature step leads to undesirable dopant diffusion and constrains the maximum carrier concentration to solid solubility limits [28]. For the tunnel diodes described here reducing diffusion is advantageous.

The strong temperature dependence of the surface segregation ratio has been exploited to obtain sharp n-type δ-doped layers without the parasitic dopant tail. The measured surface segregation ratio, r (ratio of surface, $N_{Surf}$, to bulk, $N_{Bulk}$, dopant concentrations), of Sb in Si as a function of growth temperature. The surface segregation can be manipulated over 320–550° C. for a potential four-orders-of-magnitude reduction in dopant incorporation. Additionally, there is a second effect that reduces the surface segregation ratio by up to a factor of ten: high dopant surface coverages reduce the surface free energy and the driving force for surface segregation leading to self-limiting segregation phenomenon [29]. This effect lowers the low temperature (≦400° C.) r value by nearly ten times for surface concentrations exceeding $2-3 \times 10^{14}$ cm $-2$ [24]. In this invention, these phenomena are exploited and low temperatures are employed to incorporate Sb into δ-doped layers. The dopant tail is virtually eliminated by cycling to moderate substrate temperatures that considerably reduce Sb incorporation inducing residual dopant to "float" on the growing surface while simultaneously minimizing dopant diffusion.

The traditional view of MBE was that a limiting epitaxial temperature, $T_E$, existed [30]. It was believed that growth below this temperature (taken to be 400° C.) could not be crystalline or device quality. D. Eaglesham, H. J. Gossmann, and E. F. Schubert have introduced a new theory stating that for a given growth temperature, growth will initially proceed in a crystalline fashion until some critical thickness, $h_{epi}$ is reached [31]. Beyond $h_{epi}$, the film will first become polycrystalline, and then will become amorphous. Amazingly even for growth at 100° C., it is possible to grow several crystalline atomic monolayers. When the temperature is elevated to 320° C. (the temperature shown by Hobart to suppress Sb segregation [24]), this thickness is increased to 150 nm.

One method for characterizing the existence of this thickness is via oscillations in reflective high-energy electron diffraction (RHEED) patterns during growth. It has been shown that strong oscillations in intensity correspond to layer-by-layer growth; layers showing damped oscillations are of poor crystalline quality [32,33]. Growth at temperatures as low as 220° C. clearly results in strong RHEED oscillations. Growth at 50° C. shows severely damped oscillations, suggesting that 50° C. will not yield a good film.

Films grown by SPE suffer from incomplete dopant activation. In this regard, LT-MBE is superior to SPE. Sb doped films grown at 270° C. show unity activation for doping concentrations as high as $5 \times 10^{20}$ cm$^{-3}$ [34]. B films grown at the same temperature show unity activation above $10^{21}$ cm$^{-3}$ [35]. Clearly if the doping level is a more stringent requirement than the sharpness of the spike, LT-MBE is a preferable approach.

Of course, it is expected that films grown by LT-MBE will have more defects than those grown by standard MBE temperatures. It is believed that LT-MBE leads to the presence of vacancy-like defects throughout the film [36]. One approach to removing these defects is annealing the samples in an RTA furnace.

Simple device applications have shown the benefit of introducing a post growth anneal. Gossmann et al demonstrated a pair of p-n junction diodes grown at 220° C. with doping levels in the mid-$10^{17}$ cm$^{-3}$ range on either side of the junction [34]. Samples annealed at 450° C. were found to have an ideality factor of 1.94, indicating a heavily defected layer. Samples annealed at 600° C. were found to have significantly improved ideality factors of 1.05. This evidence suggests that the RTA served to remove many of the defects in the film, thereby leading to improved device performance.

Another approach has been developed by Jorke et al. [37,38]. Their structure consisted of a p$^+$-i-n$^+$ junction and grown at 325° C. The p$^+$ region was doped 3×10$^{19}$ cm$^{-3}$, and the n$^+$ region was doped 1×10$^{20}$ cm$^{-3}$. When the i-region is reduced to 5–10 nm, room temperature NDR was observed with a PVCR of two.

An alternate approach has been developed by Morita et al. [39,40]. Their structure is an interband tunnel Esaki tunnel diode being developed for low power memory applications. The structure consists of a degenerately doped substrate region, a thin SiO$_2$ tunnel barrier, and an amorphous contacting region. The relative simplicity of the structure and use of an SiO$_2$ tunnel barrier makes it immediately compatible with a CMOS process. Because the oxide has a large band offset in the conduction band, the thermal currents in this structure will be highly reduced. Theoretically, this should result in elevated PVCR. However, the highest PVCR observed by this group is approximately 1.8 at an ultra low current density of 3×10$^{-6}$A/cm$^2$.

A final approach was developed by Zhu et al. [41,42], where a p$^+$ δ-doping layer (3×10$^{13}$ cm$^{-2}$) was first grown, followed by 4 nm of undoped Si and an n$^+$ δ-doping layer (1×10$^{14}$ cm$^{-2}$). The entire structure was grown around 500–550° C., which was too high and led to deleterious dopant segregation and diffusion. No room temperature NDR was observed.

The present invention presents the first demonstration of room temperature negative differential resistance (NDR) in an epitaxially grown Si based Resonant Interband Tunnel Diode [43–52]. The previous discussion has shown that the possibility of realizing this structure may be achieved by controlling of the dopant distributions by LT-MBE growth followed by a post-growth anneal. Based on this principle, nearly every design presented in the remainder of this invention includes at least one of the features listed below:

An intrinsic tunneling barrier;

δ-doped injectors to create confined quantum states;

Offsets of the δ-doping planes from the heterojunction interfaces to minimize dopant outdiffusion;

Low temperature molecular beam epitaxial growth (LT-MBE); or

Post-growth rapid thermal annealing (RTA) for dopant activation and/or point defect reduction.

The variation in δ-doping placement was chosen because of two issues relevant to the RITDs of this study: the effects of growth interruption and dopant outdiffusion. A δ-doped layer is in essence a stop-growth. Stop-growths are commonly employed to smoothen the growth front profile and reduce heterojunction roughness [53,54]. During a stop-growth, the growth rate drops considerably, but the impurity accumulation rate rises dramatically, which has been shown to quench quantum well photoluminescence [54]. Also, dopant outdiffusion from the δ-doped spike is expected to be preferentially oriented towards the undoped central SiGe spacer, rather than the highly doped outer Si injector layers, due to the concentration gradient. Furthermore, Sb diffusion [55,56] has been shown to be enhanced with increased Ge content whereas B diffusion [57] has been shown to be suppressed with the addition of Ge. Thus, the placement of the δ-doped layers offset from the SiGe spacer using undoped Si reduces these effects and provides a higher quality tunneling barrier with reduced defects and higher PVCR.

SUMMARY OF THE INVENTION

The present invention provides a Si-based tunnel diode that uses a planar process suitable for integration with CMOS or Si/SiGe heterojunction bipolar technology.

The present invention also provides a Si-based tunnel diode that shows room temperature negative differential resistance (NDR).

Additional advantages of the invention will be set forth in part in the description which follows, and in part will be obvious from the description, or may be learned by practice of the invention. The advantages of the invention will be realized and attained by means of the elements and combinations particularly pointed out in the appended claims.

The present invention provides a family of Si compatible tunnel diode structures. In general, the diodes are defined by forming an N$^+$ (or P$^+$) contact layer, an N$^+$ (or P$^+$) injection layer, a tunnel barrier (doped or undoped) sandwiched between spacer layers (doped or undoped), a P$^+$ (or N$^+$) injection layer, and a P$^+$ (or N$^+$) contact layer.

The present invention further provides a class of the aforementioned tunnel diodes such that the structure is defied by an N$^+$ (or P$^+$) contact layer, an N$^+$ (or P$^+$) injection layer, a tunnel barrier (doped or undoped) sandwiched between a pair of spacer layers (doped or undoped), a quantum well (the quantum well may be defined by delta doping, band discontinuities resulting from heterojunction interfaces, superlattices, or a combination thereof), a P$^+$ (or N$^+$) injection layer, and a P$^+$ (or N$^+$) contact layer.

According to a preferred embodiment, there is a variation of the aforementioned tunnel diodes differentiated by the presence of a quantum well on either side of the tunnel barrier. The structure comprising of a P$^+$ (or N$^+$) contact layer, a P$^+$ (or N$^+$) injection layer, a quantum well (the quantum well may be defined by delta doping, band discontinuities resulting from heterojunction interfaces, superlattices, or a combination thereof), a tunnel barrier (doped or undoped) sandwiched between a pair of spacer layers, a quantum well (the quantum well may be defined by delta doping, band discontinuities resulting from heterojunction interfaces, superlattices, or a combination thereof), an N$^+$ (or P$^+$) injection layer, and an N$^+$ (or P$^+$) contact layer.

An additional embodiment of the invention results from the growth of a pnp (or npn) tunnel diode with dual tunnel barriers. One feature of this layer is that its electrical characteristics are symmetrical with applied bias, resulting in the onset of negative differential resistance in the forward and reverse directions. The structure is defined by a P$^+$ (or N$^+$) ohmic contact layer, a P$^+$ (or N$^+$) injection layer, a quantum well (the quantum well may be defined by delta doping, band discontinuities resulting from heterojunction interfaces, superlattices, or a combination thereof) in the valence (or conduction) band with, a tunnel barrier (doped or undoped) sandwiched between a pair of spacer layers (doped or undoped), a quantum well (the quantum well may be defined by delta doping, band discontinuities resulting from heterojunction interfaces, superlattices, or a combination thereof) in the conduction (or valence) band with, a second tunnel barrier (doped or undoped) sandwiched between a pair of spacer layers (doped or undoped), a quantum well (the quantum wee may be defined by delta doping, band discontinuities resulting from heterojunction interfaces, superlattices, or a combination thereof) in the valence (or conduction) band with, a P$^+$ (or N$^+$) injection layer, and a P$^+$ (or N$^+$) contact layer.

Further, embodiments of the present invention describe the post-growth heat treatment of the aforementioned structural embodiments, and the resulting influence on the current-voltage characteristics.

Further, embodiments of the present invention the epitaxial growth and thermal cycling necessary to realize the aforementioned structural embodiments.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention. In the drawings.

DESCRIPTION OF THE PREFERRED EMBODIMENTS

Figure 1:
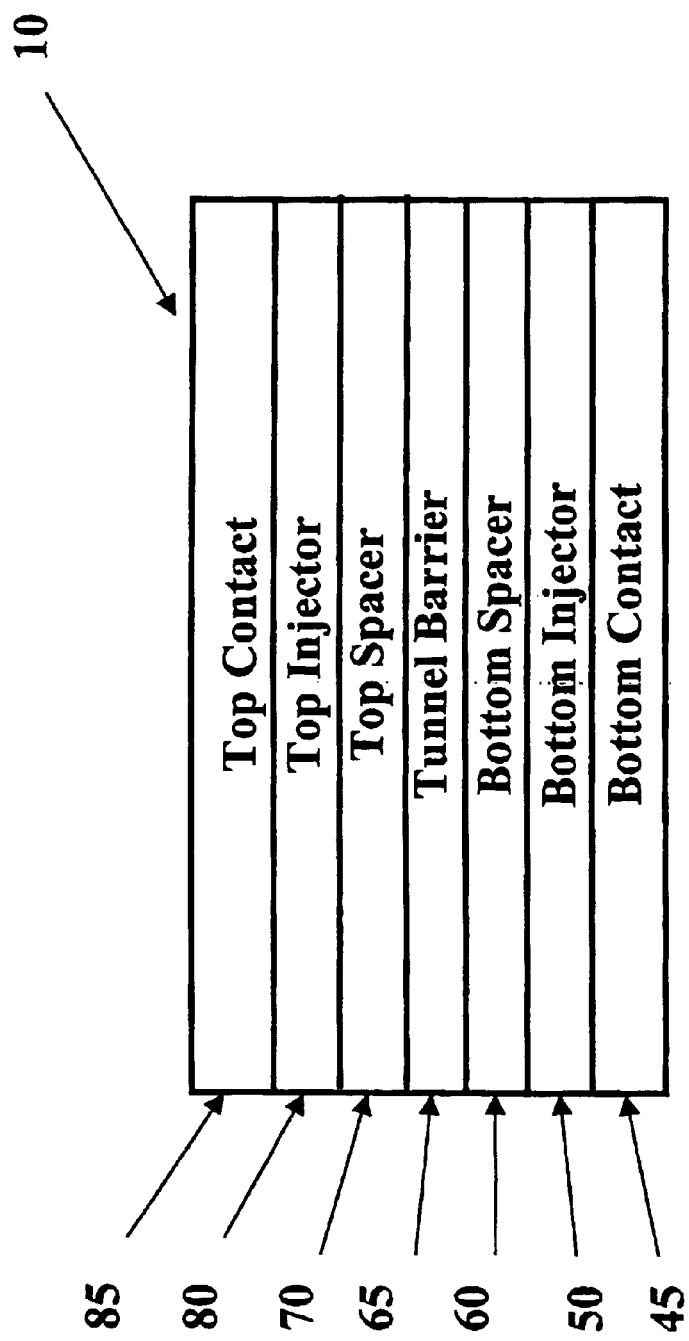
FIG. 1 represents the cross-sectional view of a Si-based interband tunnel diode in accordance with a first embodiment of this invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, the applicants provide these embodiments so that this disclosure will be thorough and complete, and will fully convey the scope of the invention to those skilled in the art. It should be readily apparent to those skilled in the art that the invention set forth herein would be in close proximity to a suitable platform, such as but not limited to an appropriate semiconductor substrate, insulator or ceramic, and further therein that suitable electrical contacts would be provided to the ohmic contact regions of the invention and thereby provide a desirable low resistance electrical connection.

Furthermore, it should be understood that the terminology of "Si-compatible" layers refers to any material which may be readily deposited, oxidized, converted, or grown on a Si substrate or device. Such layers may include but are not limited to the following: Si, Ge, C, Sn, Si$_{1-x}$Ge$_x$, Si$_{1-x}$C$_x$, Si$_{1-x}$Sn$_x$, Si$_{1-x-y}$Ge$_x$C$_y$, Si$_{1-x-y-z}$Ge$_x$C$_y$Sn$_z$, Si$_{1-x}$O$_x$, Si$_{1-x}$N$_x$, Al$_{1-x}$O$_x$, (where x, y, and z are 0–100) or combinations thereof. The terminology "quantum well" refers to a region in which a bound state may exist, suitable for hole or electron confinement, and may be provided for but not limited to a layer or a boundary between two layers in which an offset in the band energies exists. Examples of said quantum well can be created by a delta-doping region (a localized region of high doping), a heterojunction where two different materials are joined together, a superlattice, or a combination thereof. The terminology "dopant" refers to the inclusion of one of B, Ga, In, or Al, alone or in combination if the layer is doped p$^+$ and if the layer is doped n$^+$, may be doped with any of P, Sb, As, or Bi, alone or in combination thereof. It will be apparent to those skilled in the art the nomenclature "top" and "bottom" are herein utilized for descriptive purposes only in reference to said figures, and that the layer order may be inverted such that the sequence of said layers is preserved. Furthermore, it is understood that the electrical polarity of the "top" and "bottom" layers are generally opposite in nature. That is, the "top" may refer to an n-type material concurrent with "bottom" referring to a p-type material, or alternatively "top" may refer to a p-type layer concurrent with "bottom" referring to an n-type layer. Furthermore, the term layering includes, but is not limited to, depositing, oxidizing, converting, or growing and further does imply direct contact of any kind.

Like characters refer to like elements throughout. For greater clarity, the sizes of the elements have been exaggerated. The first three generic embodiments are designated by a numeral below 40. The layers of said embodiments are in turn designated by numerals above 40, wherein each assigned numeral refers to a layer of specific functionality which may or may not be present in each embodiment. These assigned layer numerals are consistent throughout the embodiments. For example, it will be understood that all layers designated 45 serve as the "bottom contact" layer, specifications of which are provided below.

Furthermore, the present invention sets forth embodiments of processes for the epitaxial growth of a Si-compatible interband tunnel diode and an appropriate heat cycling process to achieve a desired negative differential resistance.

Referring now to FIG. 1, a Si-compatible interband tunnel device 10 according to the present invention will now be described. As shown in FIG. 1, the device is a layer structure including a bottom injector 50, a bottom spacer 60, a tunnel barrier 65, a top spacer 70 and a top injector 80, usually formed of Si-compatible material, sandwiched between contact layers 45 and 85, usually formed of a Si-compatible material.

Figure 2:
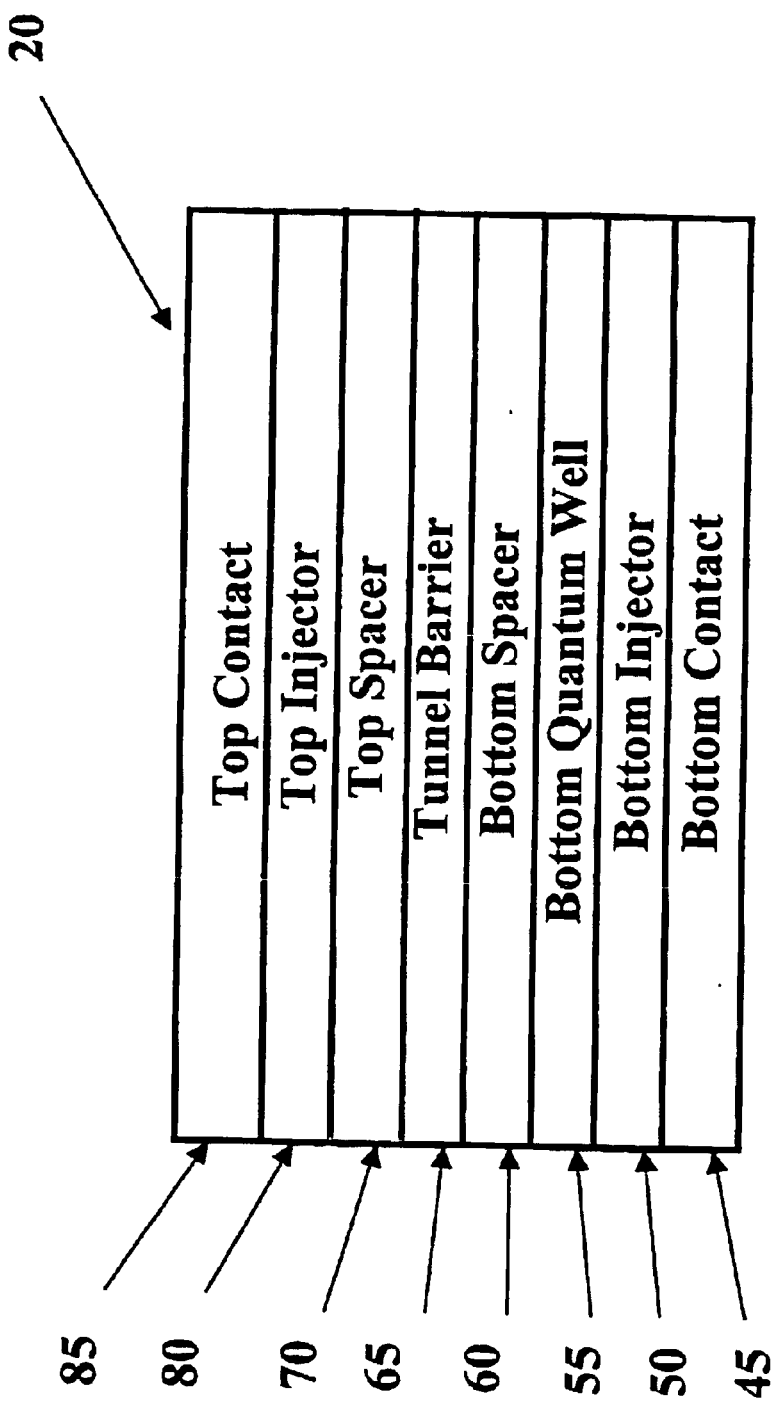
FIG. 2 represents the cross-sectional view of a Si-based interband tunnel diode with a single quantum well in accordance with a second embodiment of this invention.

FIG. 2 presents an alternative preferred embodiment of a Si-compatible interband tunnel device 20 with a quantum well 55 according to the present invention, which will now be described. As shown in FIG. 2, the device is a layer structure which includes: a bottom injector 50, a bottom quantum well 55, a bottom spacer 60, a tunnel barrier 65, a top spacer 70 and a top injector 80, usually formed of Si-compatible material, sandwiched between contact layers 45 and 85, usually formed of a Si-compatible material. It will be apparent to those skilled in the art the layer arrangement may be inverted such that the bottom quantum well 55 may be adjacent to, but not necessarily touching either the n-type or p-type side of the interband tunnel diode. Furthermore, it is apparent as stated above that the order of the layer sequence could place the bottom quantum well 55 as an upper layer in the layer sequence and any combination thereof.

Figure 3:
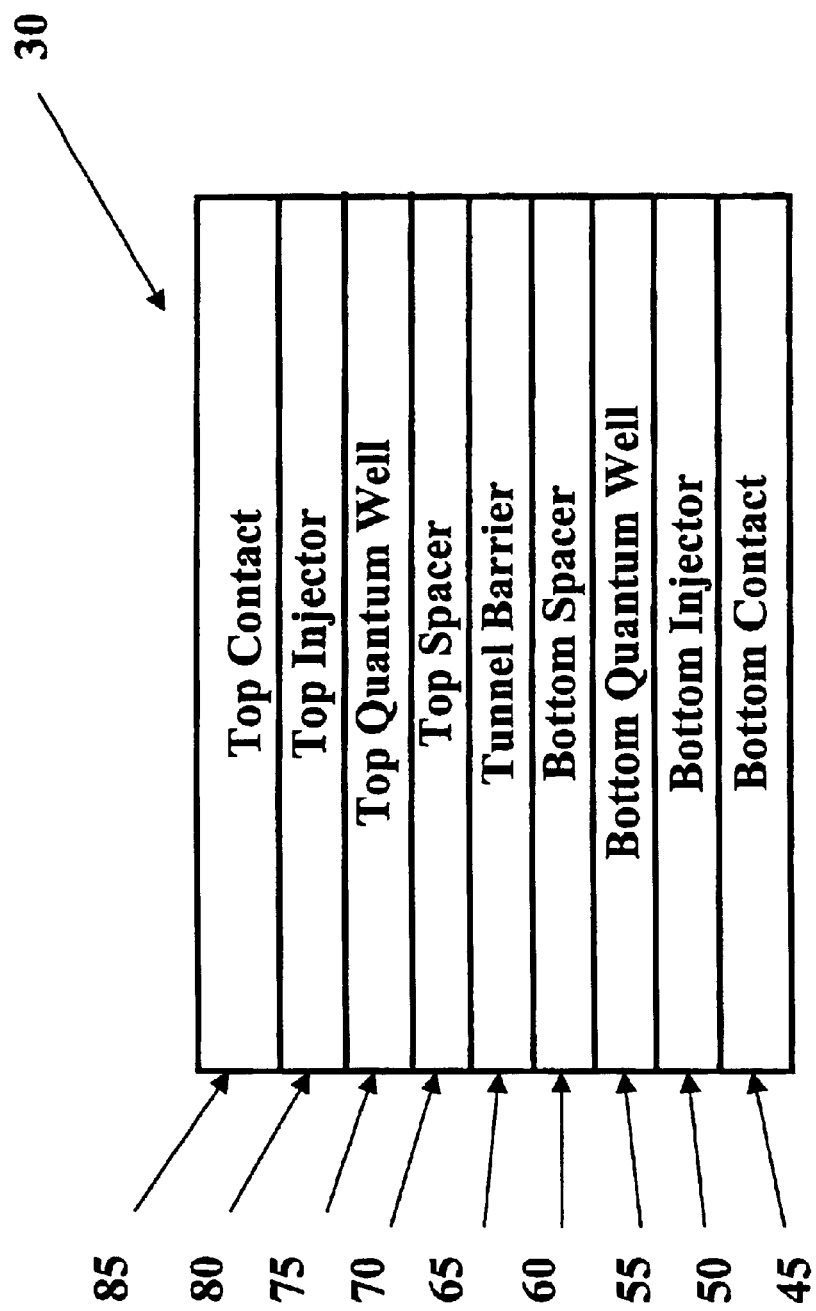
FIG. 3 represents the cross-sectional view of a Si-based interband tunnel diode with dual quantum wells in accordance with a third embodiment of this invention.

FIG. 3 illustrates an additional preferred embodiment of a Si-compatible interband tunnel device 30 with a quantum well 55, 75 on either side of the tunnel barrier 65 according to the present invention which will now be described. As shown in FIG. 3, the device is a layer structure which includes: a bottom injector 50, a bottom quantum well 55, a bottom spacer 60, a tunnel barrier 65, a top spacer 70, a top quantum well 75 and a top injector 80, usually formed of Si-compatible material, sandwiched between contact layers 45 and 85, usually formed of a Si-compatible material. It will be apparent to those skilled in the art the layer arrangement may be inverted such that the bottom quantum well 55 may be adjacent to, but not necessarily in direct contact with either the n-type or p-type side of the interband tunnel diode. Furthermore, it is apparent as stated above that the order of the layer sequence could place the bottom quantum well 55 as an upper layer in the layer sequence and any combination thereof.

Although the present invention has been described above in conjunction with the embodiments illustrated in FIGS. 1, 2, and 3 as well as variations therein, the present invention may also be varied in several other ways.

Contact layers 45 and 85 may have a thickness from 0–25000 nm, or more preferably, in the range of 0–10000 nm, 0–5000 nm, 0–1000 nm, 0–500 nm, or 0–100 nm. These layers may be doped in the range of $1\times10^{10}/cm^3$ to $1\times10^{22}/cm^3$, or more preferably in the range of $1\times10^{17}/cm^3$ to $5\times10^{20}/cm^3$, $1\times10^{15}/cm^3$ to $5\times10^{21}/cm^3$, or $1\times10^{17}/cm^3$ to $5\times10^{21}/cm^3$.

Injector layers 50 and 80 may have a thickness ranging from 0–25000 nm, or more preferably in the range of of 0–10000 nm, 0–5000 nm, 0–1000 nm, 0–500 nm, or 0–100 nm. These layers may be doped in the range of $1\times10^{10}/cm^3$ to $1\times10^{22}/cm^3$, or more preferably in the range of $1\times10^{18}/cm^3$ to $5\times10^{19}/cm^3$, $1\times10^{15}/cm^3$ to $5\times10^{21}/cm^3$, or $1\times10^{17}/cm^3$ to $5\times10^{21}/cm^3$.

With respect to quantum well layers 55 and 75, these layers are suitable for hole or electron confinement, and may be provided for but not limited to a layer or a boundary between two layers in which an offset in the band energies exists. Examples of said quantum well can be created by a δ-doping region (a localized region of high doping), where those skilled in the art will be readily aware could be doped with any of B, Ga, In, Al, P, Sb, As or Bi, alone or in combination, a heterojunction where two different materials are joined together, a superlattice, or a combination thereof. In the case of structures using δ-doping, typical sheet carrier concentrations are on the order of $1\times10^{12}$ cm$^{-2}$ to $1\times10^{15}$ cm$^{-2}$.

The tunnel barrier layer 65 may have a thickness of 0–50 nm, or more preferably 0–35 nm, 0–20 nm, 0–15 nm, 0.5–11.5 nm, 1–10 nm, 2–6 nm, or 2–4 nm depending on the application. With respect to spacer layers 60 and 70, these layers provide an offset for the central tunnel barrier and may have a thickness in the range 0–50 nm, or more preferably in the range of 0–30 nm, 0–10 nm, 0–5 nm, 0–3 nm, or 0 nm to 1 nm. In the more preferred embodiments, the aggregate thickness of layers 60, 65, and 70, which is in general, but not limited to, the total tunnel barrier thickness, is generally constrained, although not limited, to less than or equal to 10 nm. As a specific example of these embodiments, consider a device of structure 30 where the aggregate thickness of layers 60, 65, and 70 is 6 nm. The sequence of layer 60/layer 65/layer 70 may be, but is not limited to, one of 1 nm Si/4 nm $Si_{0.5}Ge_{0.5}$/1 nm Si, 0.5 nm Si/5 nm $Si_{0.5}Ge_{0.5}$/0.5 nm Si, 1.5 nm Si/3 nm $Si_{0.5}Ge_{0.5}$/1.5 nm Si, or 6 nm $Si_{0.5}Ge_{0.5}$. It should be noted that the use of Si/$Si_{0.5}Ge_{0.5}$/Si is used solely for illustrative purposes, and the layer composition may be of any Si-compatible material as previously defined. Furthermore, one or both of the layers 60 and 70 may be present or not present, as illustrated in device structures 10 and 20. Layers 60, 65, and 70 may be undoped, very lightly doped, unintentionally doped, or doped (n- or p-type) with doping concentrations in the range of $1\times10^{10}$ cm$^{-3}$ to $1\times10^{23}$ cm$^{-3}$, more preferably in the range of $1\times10^{17}$ cm$^{-3}$ to $5\times10^{20}$ cm$^{-3}$, or $1\times10^{15}$ cm$^{-3}$ to $5\times10^{21}$ cm$^{-3}$, or $1\times10^{17}$ cm$^{-3}$ to $5\times10^{21}$ cm$^{-3}$. As will be illustrated in Example 4 of the preferred embodiments, the preferable operation occurs for lightly doped or unintentionally doped layers 60, 65, and 70 (i.e. doping concentrations $1 \times 10^{10}$ cm$^{-3}$ to $1 \times 10^{16}$ cm$^{-3}$).

Furthermore, the conditions under which the diodes described above are realized may also vary in many ways. It is apparent to those skilled in the art that there exists a preferred temperature range for each Si-compatible material which could be epitaxially grown, deposited, oxidized or transformed by any other suitable means necessary to achieve said desired effect for layers 45, 50, 80 and 85. Examples of Si compatible materials, are comprised but not limited to Group IV alloys, more specifically, Si and SiGe, which may be grown or deposited above the temperature 400° C., or more preferably above 500° C., 600° C., or 700° C. Additionally, to achieve the desired effects, layers 55, 60, 65, 70 and 75 may be epitaxially grown, deposited, oxidized or transformed by any other suitable means necessary above the temperature 400° C., or more preferably above 500° C., 600° C., or 700° C. It will be readily apparent to those skilled in the art, that an advantageous multiple temperature process for each Si compatible material utilized herein, may be required to achieve the desired effect of reduced dopant segregation and diffusion concurrently with the desired effect of reduced defect formation. An example, but not limited to, this temperature range for the examples cited herein may be in a temperature range of 200° C. and 550° C., more specifically at the initiation of layers 55 and 75, where said layers are comprised of delta-doping, the sample temperature may be initially maintained at or below 450° C., or more preferably at or below 400° C., or more preferably at or below 350° C., where upon, and concurrent with, the termination of said layer, the final sample temperature may be different than the initial temperature maintained. It may also be desirable for layers 55 and 75 to have doses of said dopants to achieve said quantum confinement in the range of $1 \times 10^{12}$ to $1 \times 10^{15}$ cm$^{-2}$, more preferably $1 \times 10^{13}$ to $5 \times 10^{14}$ cm$^{-2}$. Furthermore, to achieve said desired effect of either dopant activation or defect annealing, or concurrently both effects, which to those skilled in the art are aware may be unique to the Si-compatible material utilized a heat treatment, either during or after said layers are fashioned, whereupon said heat treatment may occur in-situ or ex-situ to the machine or apparatus which was utilized to achieve said desired effects of layer growth, deposition or oxidation may occur at a temperature in the range of 200 to 1100° C., but more preferred in the ranges of 300 to 1000° C., 450 to 900° C., 600 to 800° C., 620 to 750° C., or 650 to 680° C. To achieve said desired effects, it is apparent that a single or multiple temperature cycling may be advantageous to achieve said desired effects concurrently. Said heat treatment, could occur, but not be limited to a duration of up to six hours, or more preferably under one hour, up to ten minutes, less than or equal to two minutes, or less than or equal to one minute. It will be obvious to those practiced in the art that said heat treatment could occur, but not be limited to, an ambient gas suitable for Si-compatible materials processing such as an inert or reducing atmosphere, or moreover a reduction in ambient gas (i.e. a vacuum), preferably a combination of nitrogen and hydrogen gases are utilized to achieve the desired effect of limited oxygen and moisture content in the sample surroundings.

It will be readily apparent to those trained in the art that the enclosed embodiments of said interband tunnel diodes could be cascaded, either vertically, horizontally, or other orientation, whereby multiple tunnel junctions are serially connected to achieve a desired effect of negative differential resistance in both the reverse and forward current-voltage characteristics. Such a structure will be described, but not be limited to, the embodiment presented in Example 8.

Examples categorized below will cite specific variations to the aforementioned embodiments. However, these examples are not binding and are used specifically for the purposes of illustration.

EXAMPLE 1

Figure 4:
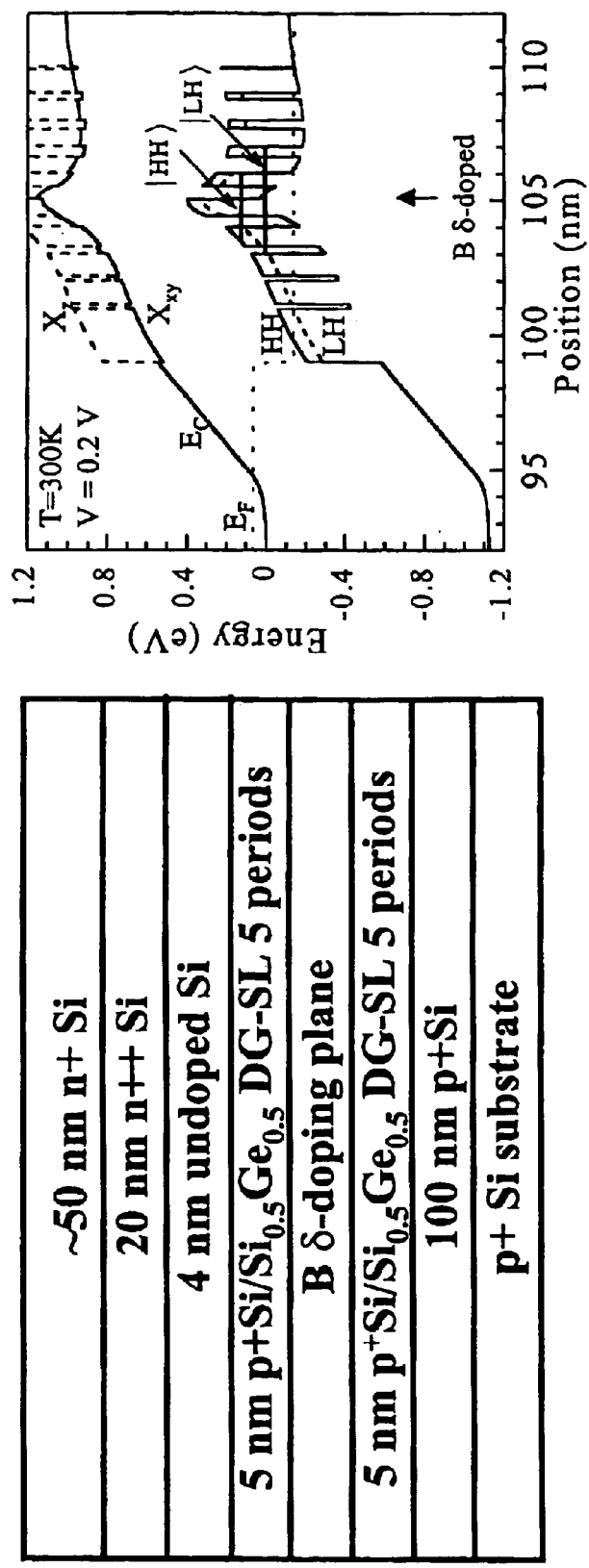
FIG. 4 is a schematic diagram and calculated band structure of a Si/Si$_{0.5}$Ge$_{0.5}$ heterojunction Esaki diode with a DG-SL formed in accordance with the principles of the present invention.
Figure 5:
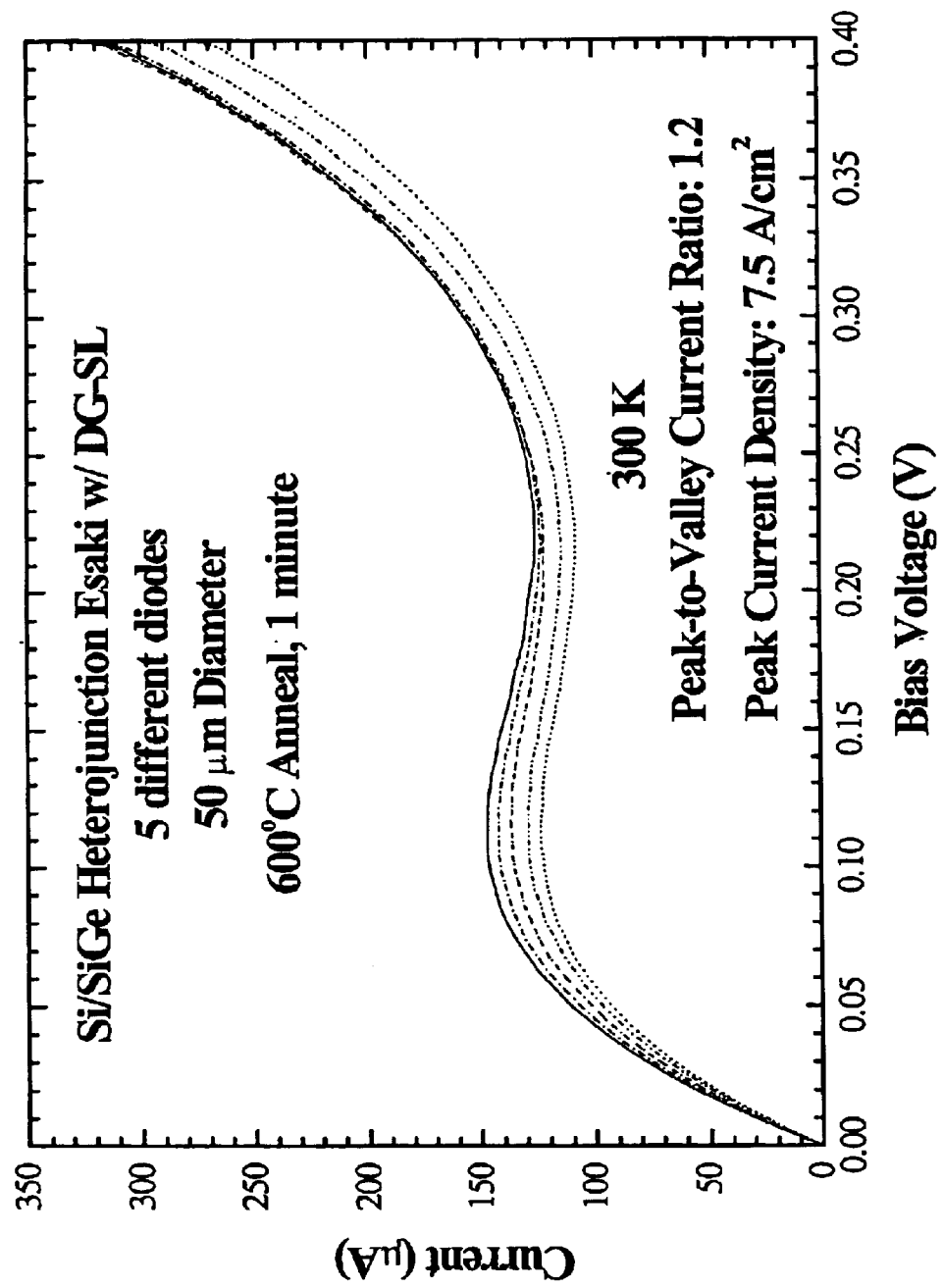
FIG. 5 shows the I–V characteristics of representative Esaki diodes formed as shown in FIG. 4.

This example illustrates an embodiment of a SiGe Heterojunction Esaki which takes advantage of the natural band offsets between Si and $Si_{0.5}Ge_{0.5}$ to lower the doping requirements on the P$^+$ side of the junction. This structure is shown in FIG. 4 with an accompanying electrostatic band diagram. A 10 nm digitally graded superlattice (DG-SL) was incorporated on the P$^+$ side of the junction to reduce the barrier for holes to populate the valence band well. Similar structures incorporated as part of InP based MSM photodetectors have been used to enhance the bandwidth, and this was a secondary motivation here [58]. In order to lower the current density for potential low power memory applications, a 4 nm intrinsic Si spacer was placed between the P$^{++}$ and N$^{++}$ layers. FIG. 5 demonstrates the I–V characteristics of this structure. NDR was observed for a 600° C., 1 min. anneal. The PVCR was found to be 1.2 at a low current density of 7.5 A/cm$^2$.

EXAMPLE 2

Figure 6:
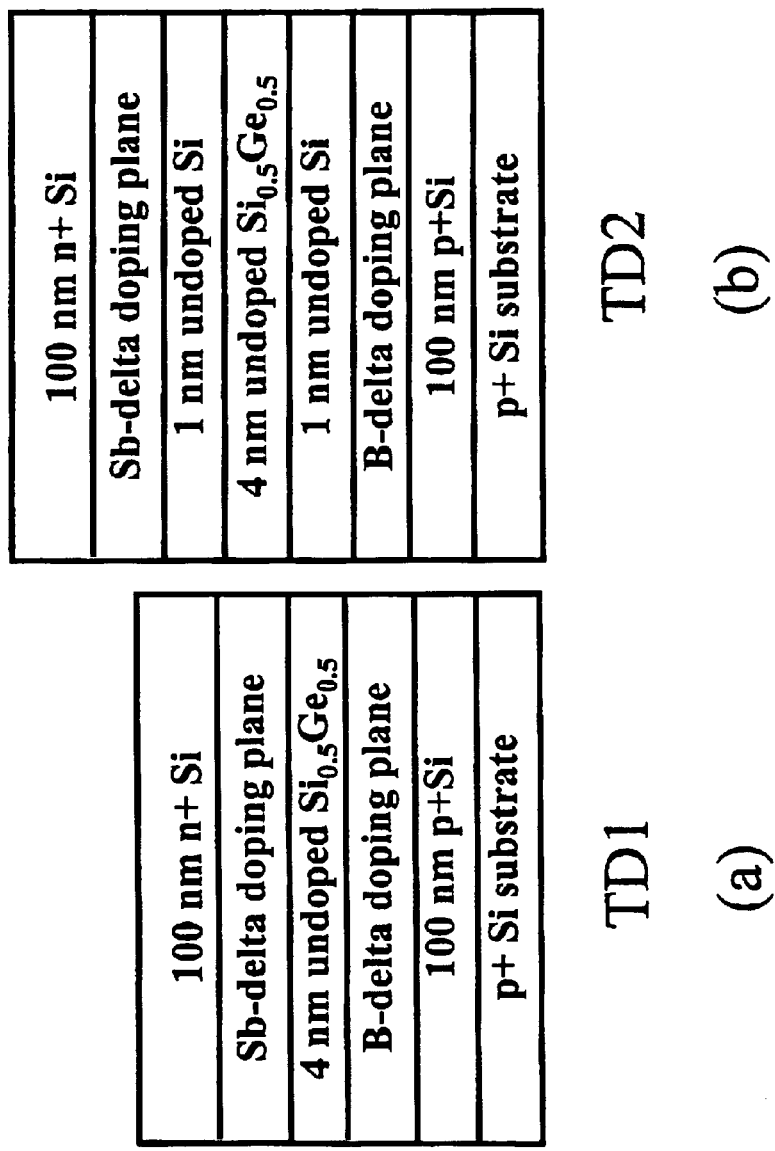
FIG. 6 shows schematic diagrams of two exemplary variations of the embodiment presented in FIG. 3. In (a), the spacer layers on either side of the 4 nm Si$_{0.5}$Ge$_{0.5}$ tunnel barrier have a thickness of 0 nm. In (b), the spacer layers have a thickness of 1 nm.

Schematic diagrams of the RITDs examined in this embodiment are shown in FIG. 6. FIG. 6(*a*) shows one configuration of the RITD, TD1, which employed a 4 nm undoped $Si_{0.5}Ge_{0.5}$ tunneling barrier and δ-doping planes at the Si/SiGe heterointerface. FIG. 6(*b*) shows another configuration, TD2, which was identical to TD1 described above, except that both δ-doping planes were offset from the Si/SiGe heterointerface with 1 nm of undoped Si on either side of the $Si_{0.5}Ge_{0.5}$ tunneling barrier. Portions of each wafer were annealed in an AG Associates Heat Pulse 610 RTA at 600° C., 700° C., or 800° C. All anneal times were fixed at 1 minute.

Figure 7:
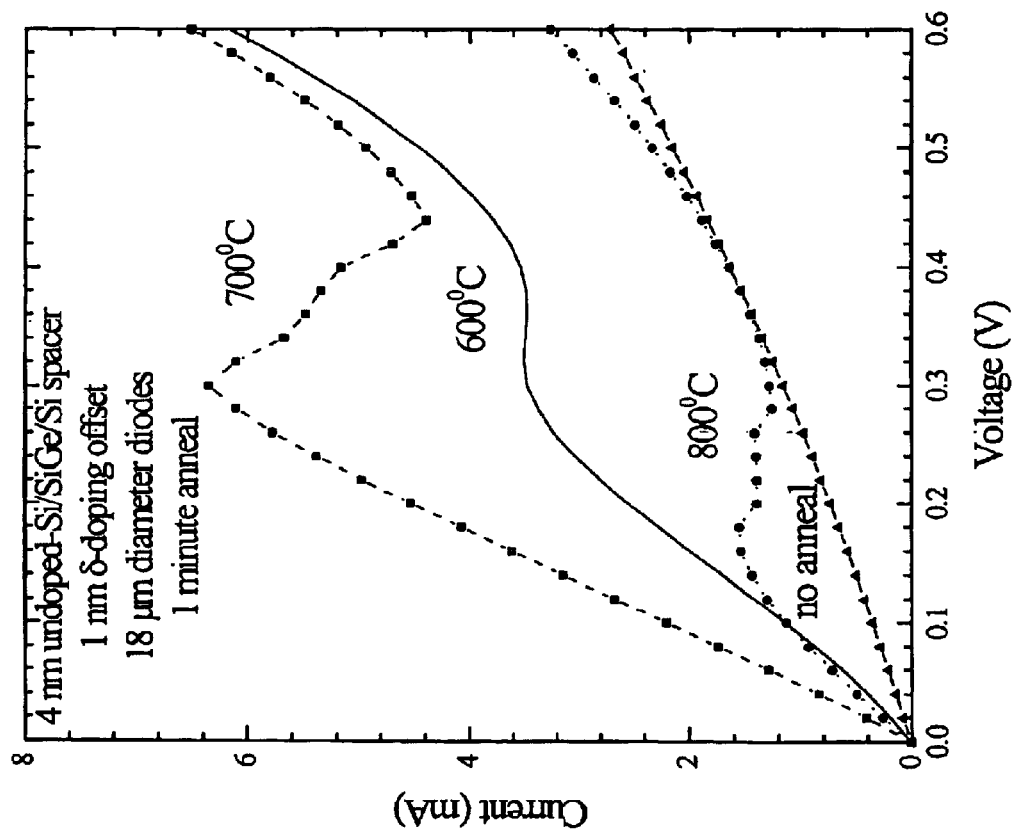
FIG. 7 shows a plot of the I–V characteristics from the Si/Si$_{0.5}$Ge$_{0.5}$/Si interband tunnel diode presented in FIG. 6(b) as a function of post-growth heat treatment. A 700° C. 1 min. anneal is shown to produce the optimal performance: a PVCR of 1.54 with a peak current density of 3.2 kA/cm$^2$.

As-grown samples show very weak inflections near the origin when unannealed. The diode performance was improved at 600° C. 1 min annealing conditions, showing a slight inflection in the I–V near 0.4 V. No NDR was evident in this layer either. For both structures, samples were annealed at 700° C. and 800° C., 1 min. The results for these two samples are summarized in TABLE 1 and shown graphically for TD2 in FIG. 7. TABLE 1 lists the resulting peak voltages, peak current densities and PVCRs for 18, 50, and 75 μm diameter diodes from the layers presented schematically in FIG. 6(*a*) and (*b*) as a function of anneal temperature. Highest PVCR values occur for a 700° C., 1 min. anneal. Best performance was observed for the 700° C. anneal; TD1 exhibited NDR as high as 1.21 at a peak current density of 2.1 kA/cm$^2$, and TD2 exhibited NDR as high as 1.54 at a peak current density of 3.2 kA/cm$^2$. An abrupt decrease in both current density and PVCR occurred for the 800° C. anneal presented here. An observation is the peak current density can be engineered during post-growth processing with a short high temperature anneal. Advantageous annealing temperatures appear to be between 600° C. and 800° C., perhaps close to the 700° C. employed here.

Figure 8:
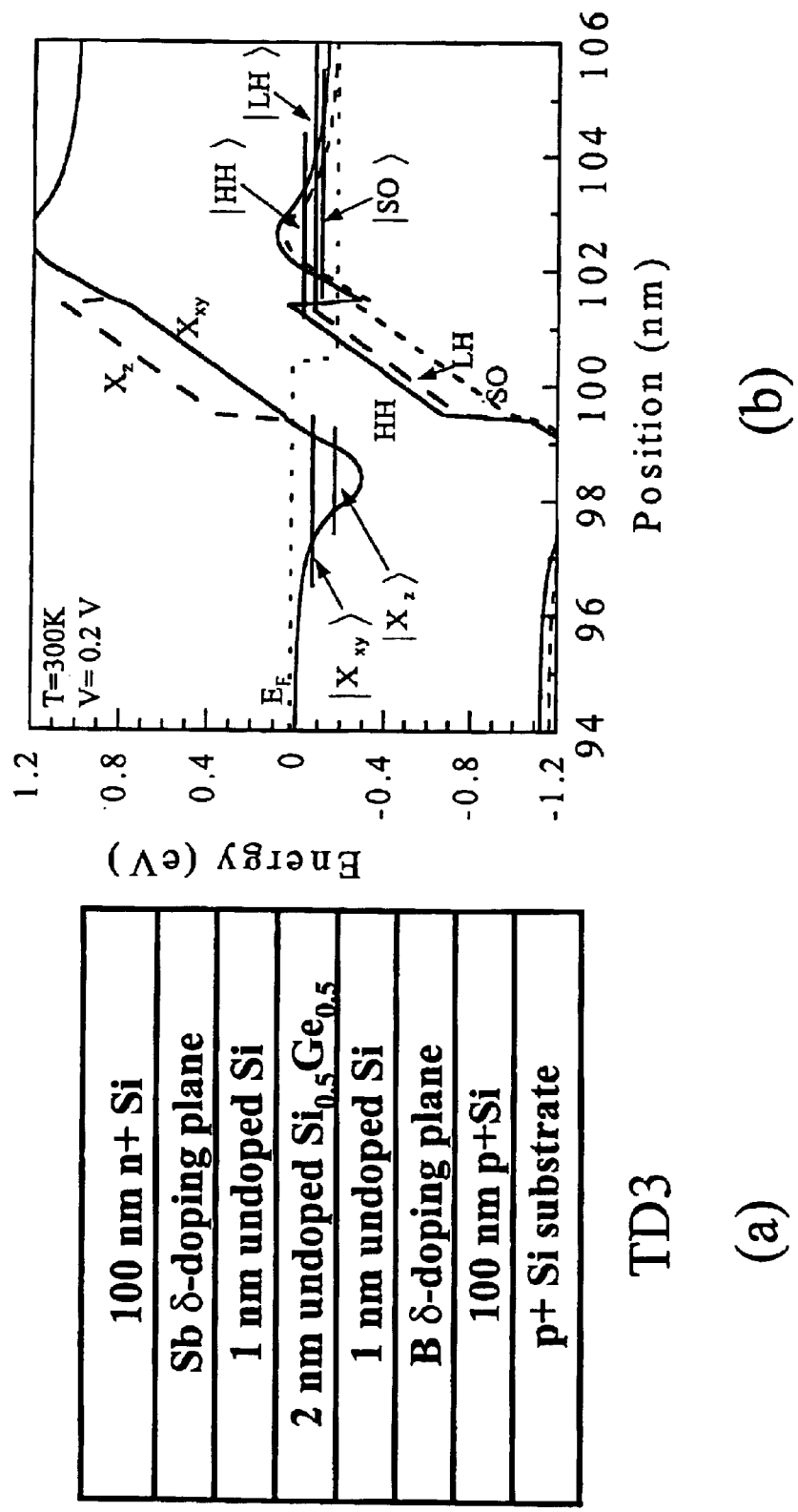
FIG. 8(a) is a schematic of an Si$_{0.5}$Ge$_{0.5}$ interband tunnel diode identical to that presented in FIG. 6(b), with the Si$_{0.5}$Ge$_{0.5}$ tunnel barrier reduced in thickness to 2 nm.
FIG. 8(b) illustrates the electrostatic band diagram of the structure.
Figure 9:
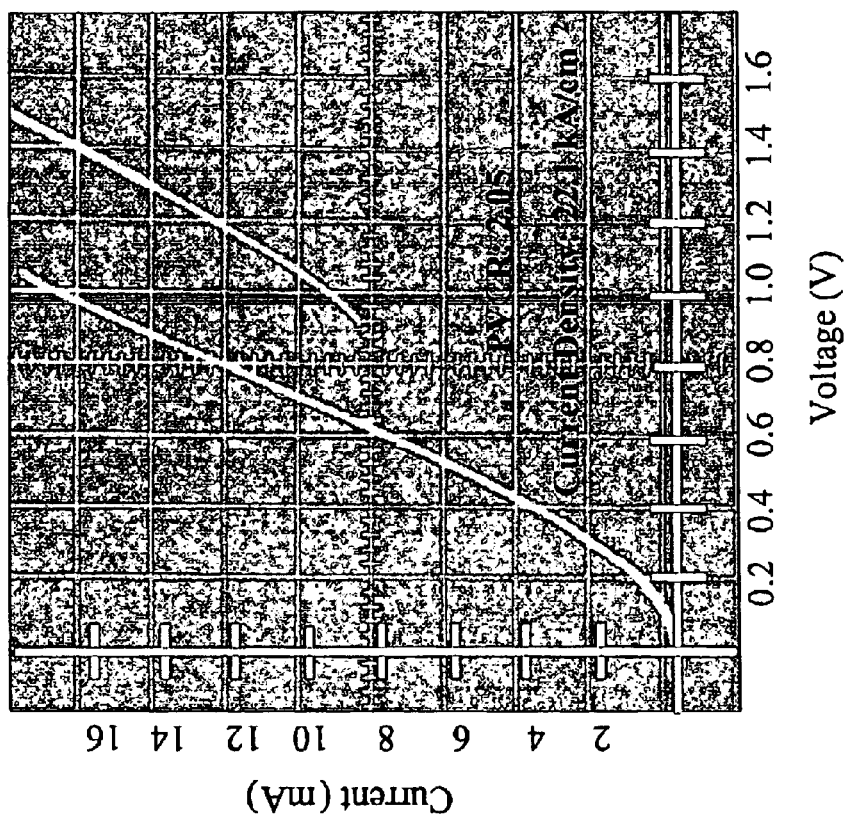
FIG. 9 shows the current-voltage characteristics of the tunnel diode presented in FIG. 8(a).

A third Si/SiGe/Si RITD layer (shown in FIG. 8) was fabricated with the spacer region reduced in thickness from 4 nm to 2 nm. The highest PVCRs and current densities again were observed for a 700° C. sample; FIG. 9 shows a curve tracer plot of a representative diode from this region which exhibited a 2.05 PVCR at a peak current density of 22 kA/cm$^2$. At 800° C., as with the TD1 and TD2, TD3 was observed to have an overall reduction in the PVCR and current density.

EXAMPLE 3

In order to address the influence of the offset in δ-doping from the heterointerface, additional layers may be fabricated. These layers, referred to as TD4 and TD5, are shown schematically in FIGS. 10 and 11, respectively. The distance between the δ-doping planes, including both the Si and SiGe layers, was fixed at 4 nm in both layers to allow a direct comparison with TD1 and TD3. The $Si_{0.5}Ge_{0.5}$ layer in TD3 was 3 nm thick, and in TD4 was 1 nm thick. Based on the previous studies, it was determined that an advantageous anneal for this structure was 700° C., 1 min. Therefore, as a comparison, both of these samples were annealed under this condition, and also at 600° C., 1 min.

Figure 10:
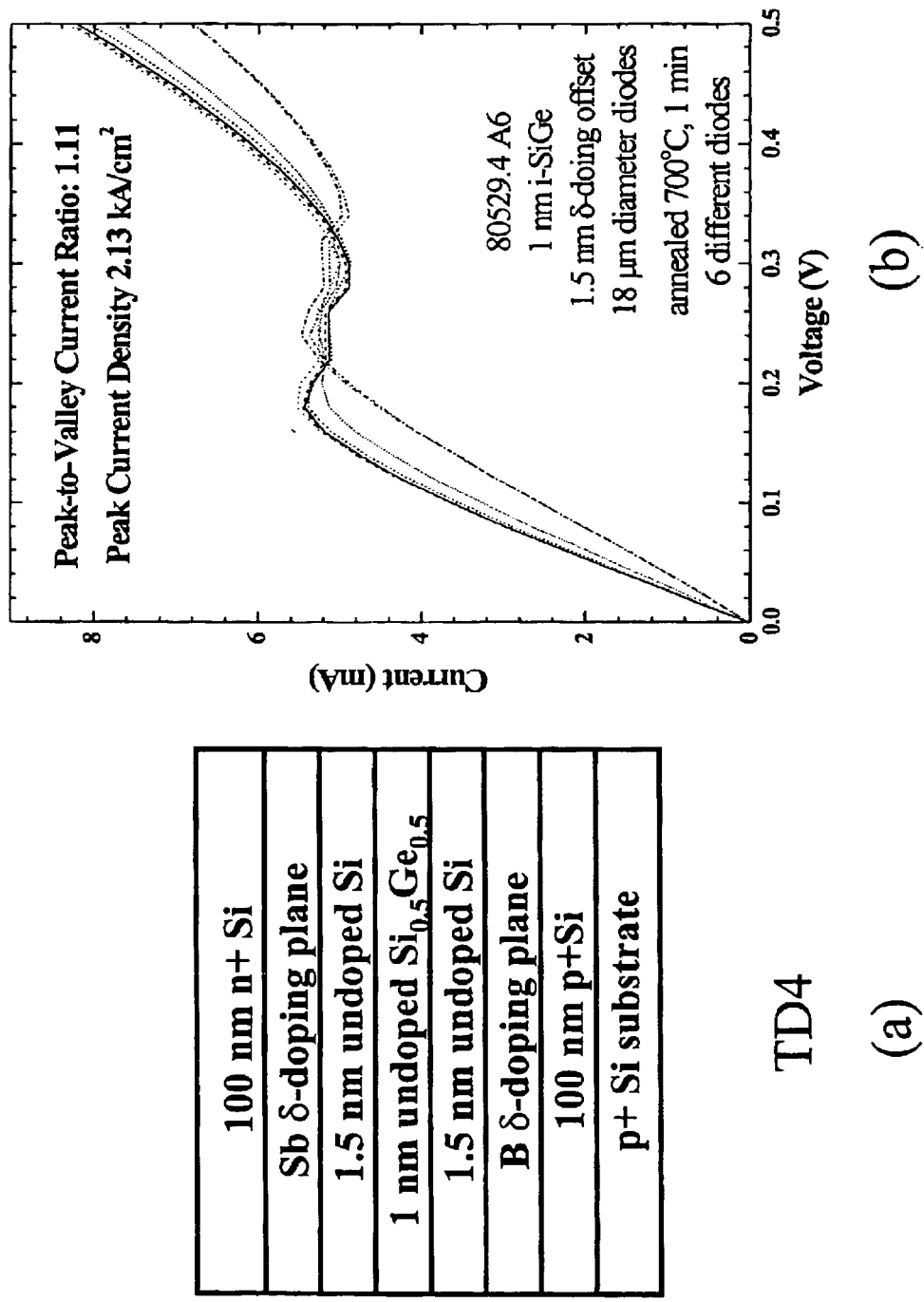
FIG. 10(a) shows the schematic diagram of a tunnel where the total distance between delta doping planes is fixed at 4 nm, wherein the spacer layers are each 0.5 nm, and the tunnel barrier is 1 nm Si$_{0.5}$Ge$_{0.5}$.
FIG. 10(b) shows the I–V characteristics of this structure.
Figure 11:
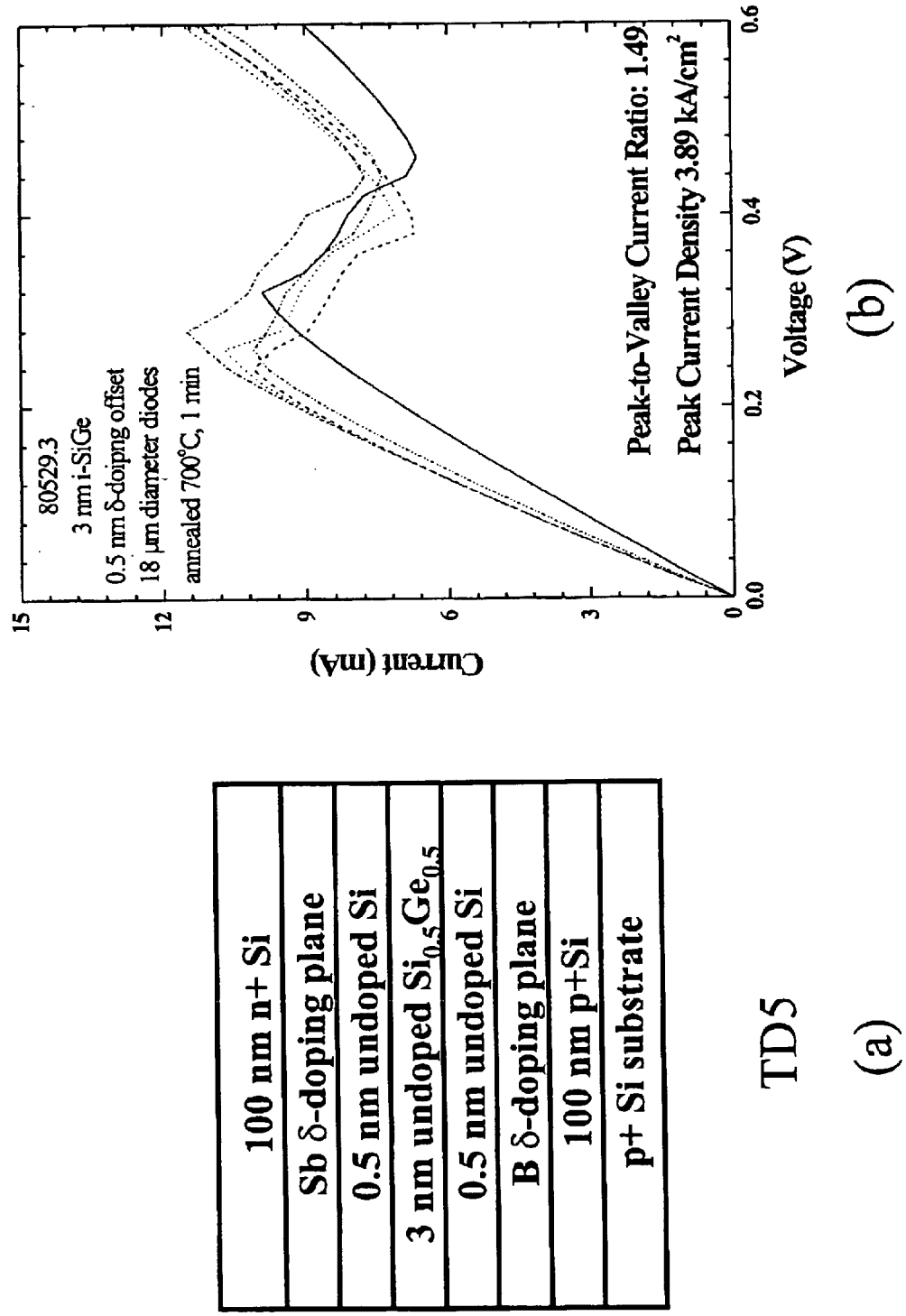
FIG. 11(a) shows the schematic diagram of a tunnel where the total distance between delta doping planes is fixed at 4 nm, wherein the spacer layers are each 0.5 nm, and the tunnel barrier is 1.5 nm Si$_{0.5}$Ge$_{0.5}$.
FIG. 11(b) shows the I–V characteristics of this structure.

The portions of both sample annealed at 600° C., 1 min only showed weak inflections in the forward directions. Consistent with the other samples investigated, NDR was observed for a 700° C., 1 min anneal. Dramatically different performance was observed between the two samples. The current density observed in both samples (3.89 kA/cm$^2$ for TD3 and 2.13 kA/cm$^2$ for TD4) was comparable to that of TD1 (2.1 kA/cm$^2$) but much less than that of TD3 (22 kA/cm$^2$). The PVCR also differed between the samples: 1.49 for TD4 and 1.11 for TD5 as compared to 1.35 for TD1 and 2.05 for TD3. The I–V characteristics observed at 700° C. are shown in FIGS. 10 and 11 for TD4 and TD5, respectively. From this data it is clear that the positioning of the δ-doping and the total material composition are relevant in determining the device properties as theorized.

EXAMPLE 4

Figure 12:
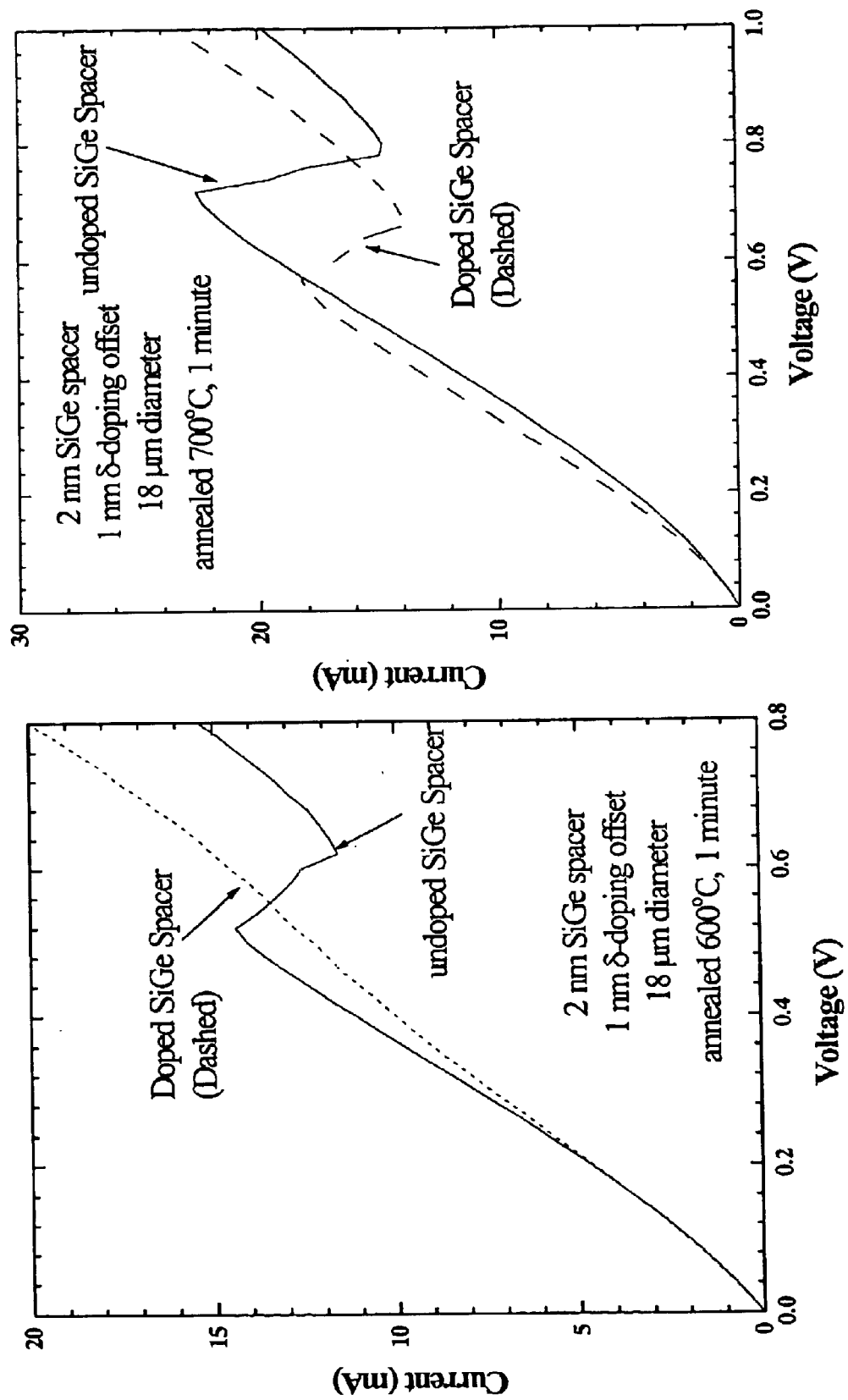
FIG. 12 shows current-voltage characteristics which illustrate the degradation in PVCR resulting from doping the tunnel barrier and spacer layers.

A study was performed to test the validity of the theory that doping the spacer region would be detrimental to the PVCR due to increased scattering. The template chosen for the study was TD3, since its performance was the best observed experimentally. Based on the previous data which showed optimal performance occurring for 700° C. anneals, it was decided to restrict the study to this temperature. A sixth tunnel diode layer, TD6, was fabricated with doping identical to the bulk region throughout each half of the spacer. FIG. 12 shows a comparison of the I–V characteristics of TD6 and TD3 under the same anneal conditions. The peak current densities are similar in magnitude, but the PVCR of TD6 (≈1.5) is much smaller than that of a comparable device on TD3 (≈1.8–1.9). Performance may not improve by doping the spacer. Similar results have been obtained for III–V RTD layers [60].

EXAMPLE 5

Figure 13:
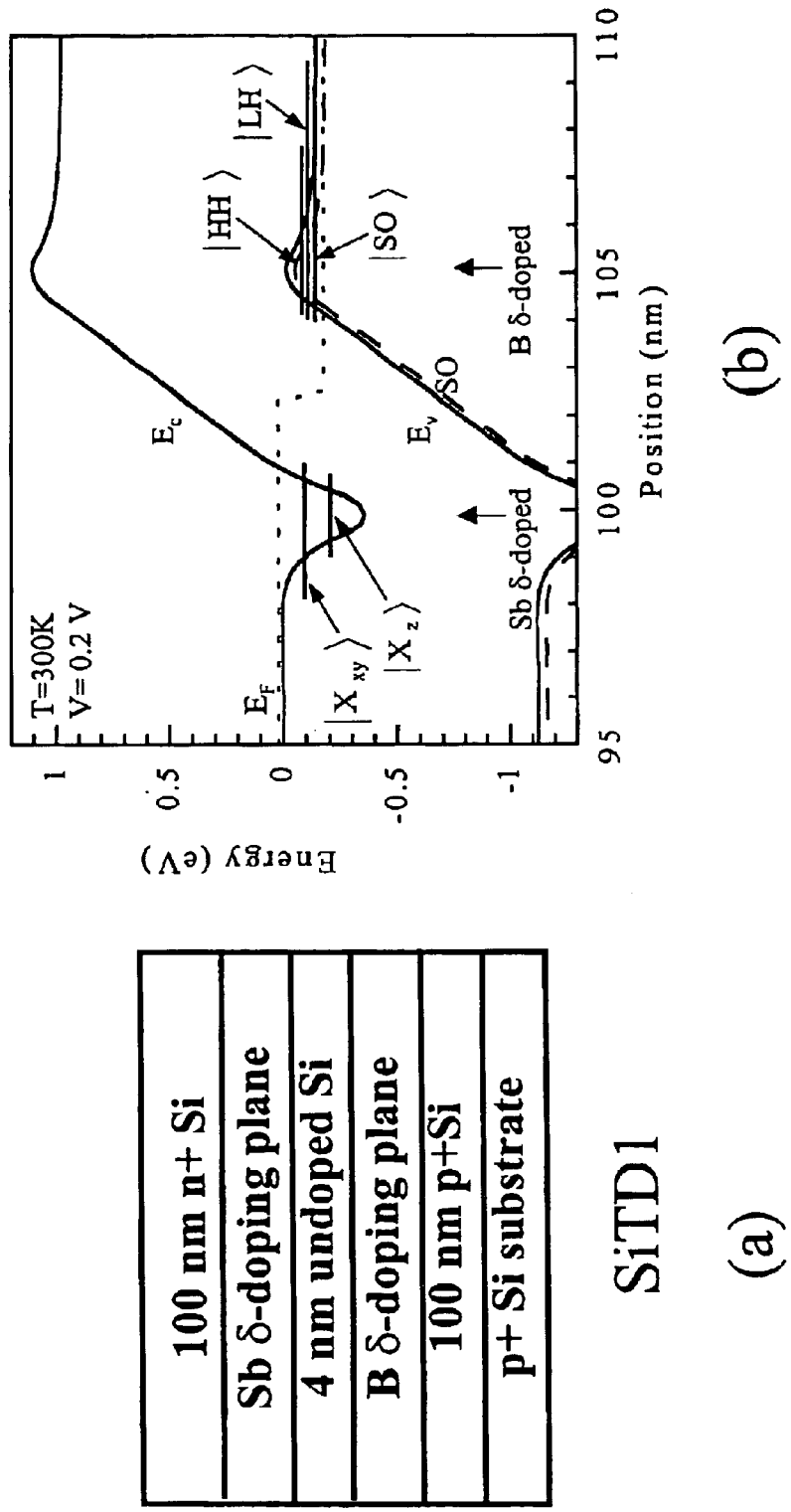
FIG. 13(a) is a schematic of a.Si interband tunnel diode with a tunnel of thickness 4 nm.
FIG. 13(b) illustrates the electrostatic band diagram of this structure.

This example presents an embodiment of the p$^+$-i-n$^+$ double quantum well interband tunnel diode. Some differences between the RITDs presented here and the Si/SiGe/Si RITDs from the previous example are: (i) a purely Si tunnel barrier eliminates critical thickness issues and strain associated with SiGe alloys, (ii) strain relaxation during the RTA heat treatments is avoided, and (iii) quantum confinement is not aided by the presence of a heterojunction discontinuity. The structure presented is shown in FIG. 13. A series of samples were then annealed for one minute at anneal temperatures of 500° C., 550° C., 600° C., 650° C., and 700° C. Post growth heat treatments again substantially improved the device performance.

TABLE 2 lists the resulting peak current densities and PVCRs for the structure presented in FIG. 13(a) and a variation of said structure where the tunnel barrier is decreased in thickness to 4 nm as a function of anneal temperature.

TABLE 2 summarizes the peak current density $J_p$, valley current density $J_v$, and PVCR of 18 μm diameter diodes resulting from each anneal temperature employed. The largest combination of $J_p$ and PVCR occurred after a 600° C., 1 minute anneal; a PVCR of 1.38 with a $J_p$ of 1.36 kA/cm$^2$ and a PVCR of 1.45 with a $J_p$ of 9.4 kA/cm$^2$ were observed for spacer thicknesses of 2 nm and 4 nm, respectively. Anneal temperatures above this optimal value led to lower values of $J_p$. It should also be noted that the degradation of Si RITDs occurred at an anneal temperature 100° C. below that of the $Si/Si_{0.5}Ge_{0.5}Si$ RITD study, possibly because the diffusion of B is more rapid in bulk Si than in $Si_{0.5}Ge_{0.5}$ alloys [46]. The fact that all entries from the 2 nm RITD in Table 2 have smaller $J_p$ and $J_v$ values than corresponding entries from the 4 nm RITD illustrates the dependence of current density on barrier thickness.

EXAMPLE 6

Figure 14:
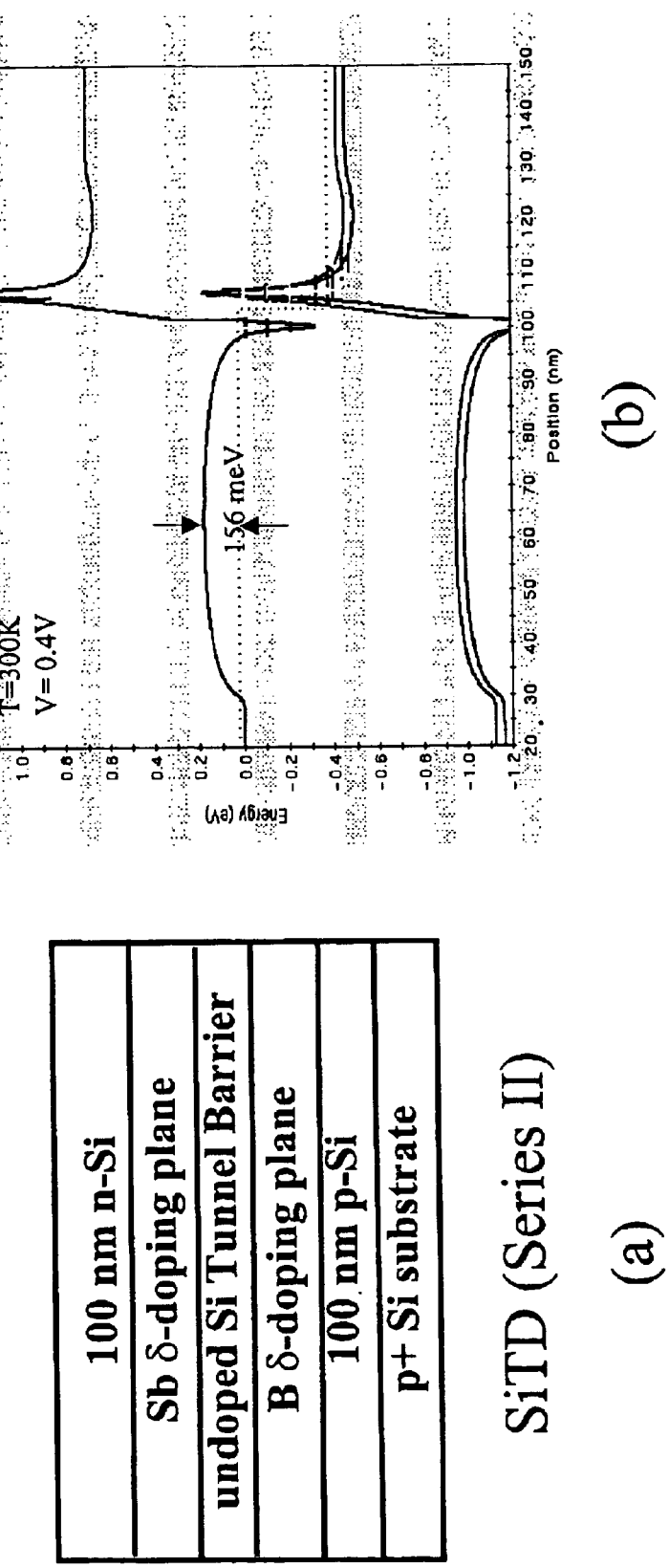
FIG. 14(a) is a schematic of a modified Si interband tunnel diode.
FIG. 14(b) illustrates the electrostatic band diagram of this structure.
Figure 15:
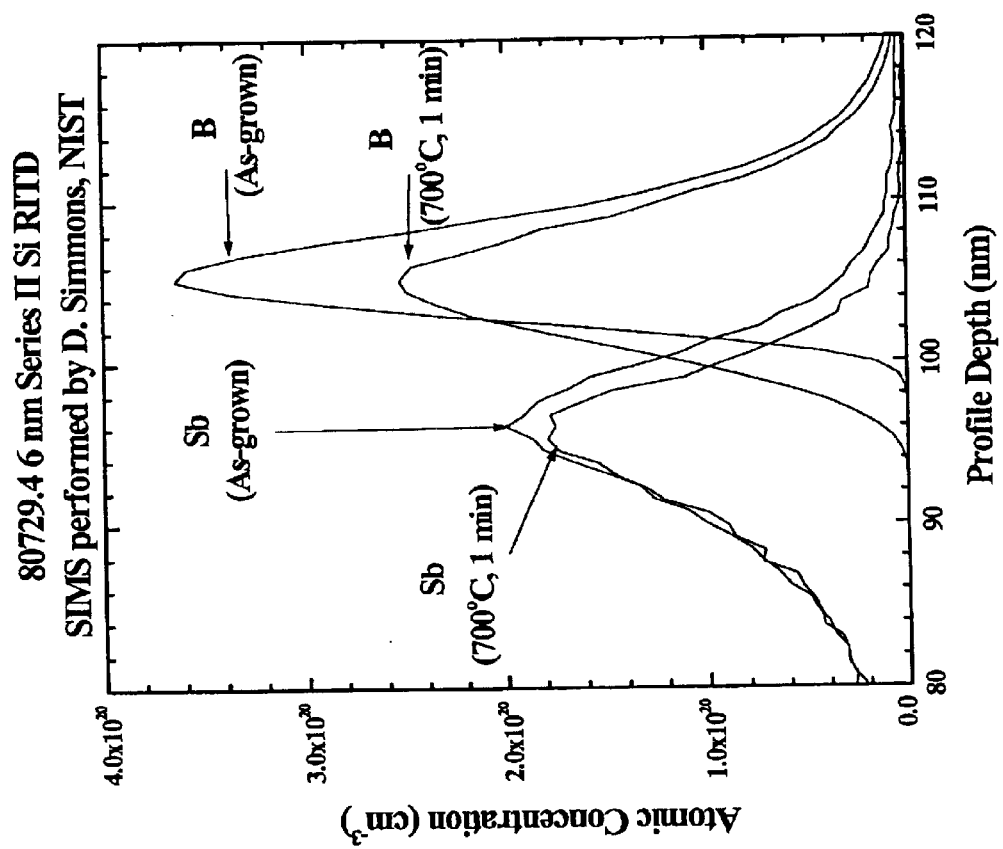
FIG. 15 shows a plot of the secondary ion mass spectrometry profile of the interband tunnel diode presented in FIG. 14(a). An anneal of 700° C., 1 min. is shown to broaden the B profile.

A modified family of Si RITDs was designed around lower growth temperatures of 320° C. In addition to the lowered growth temperature, two other adjustments of Example 3 were incorporated: (i) increased doping in the B δ-doping plane to more closely match that of the Sb, and (ii) reduction of the bulk doping to enhance the quantum confinement of the δ-doping layers. Tunnel barriers of 4 nm, 6 nm, 8 nm, and 10 nm were fabricated. FIG. 14 shows a schematic diagram of this structure. FIG. 15 shows a secondary ion mass spectrometry (SIMS) profile of the structure with a 6 nm tunnel barrier.

Figure 16:
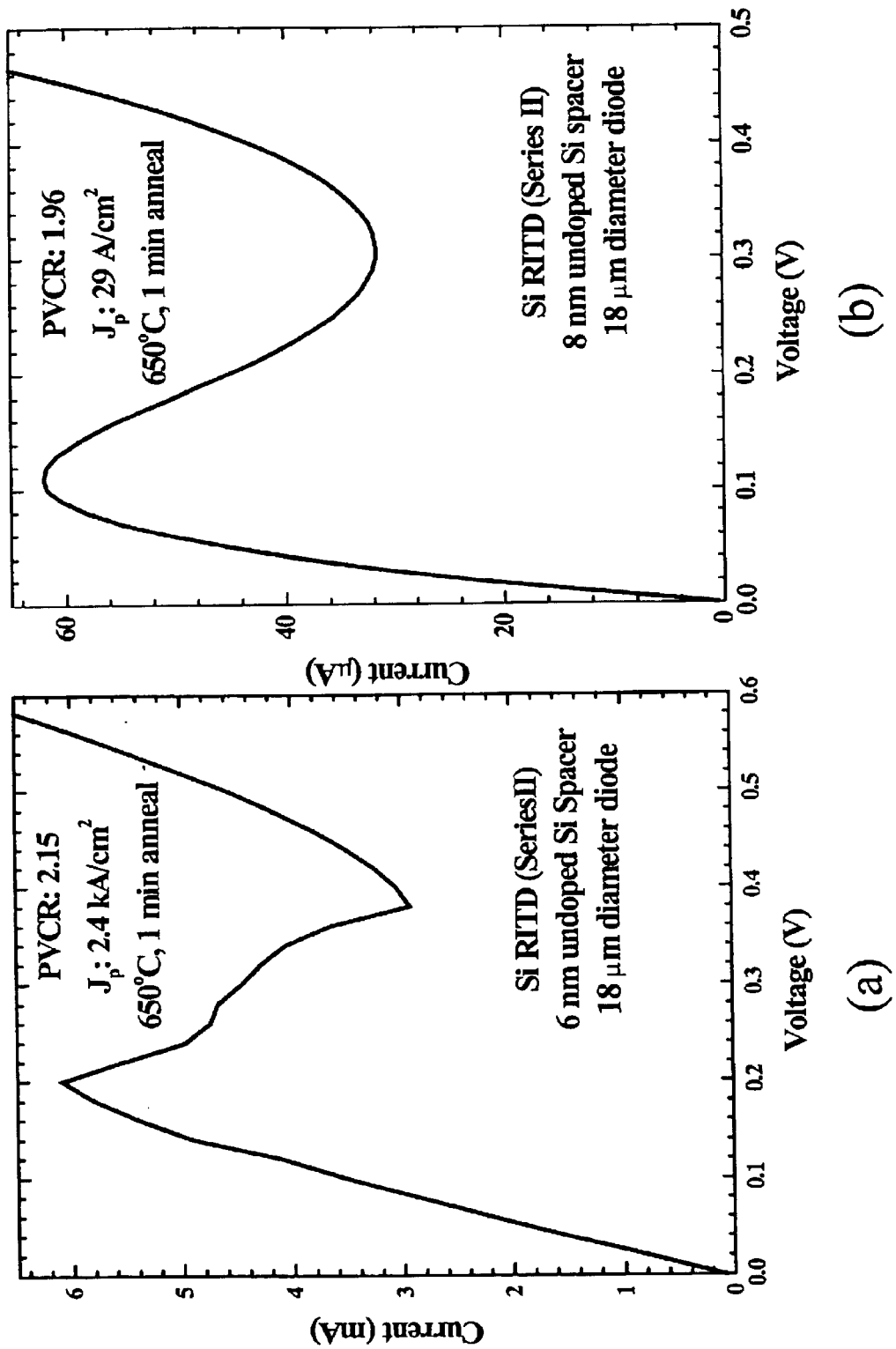
FIG. 16(a) shows the current-voltage characteristic of the structure presented in FIG. 14(a) where the undoped spacer has a thickness of 6 nm.
FIG. 16(b) shows the current-voltage characteristic of the structure presented in FIG. 14(a) where the undoped spacer has a thickness of 8 nm.
Figure 17:
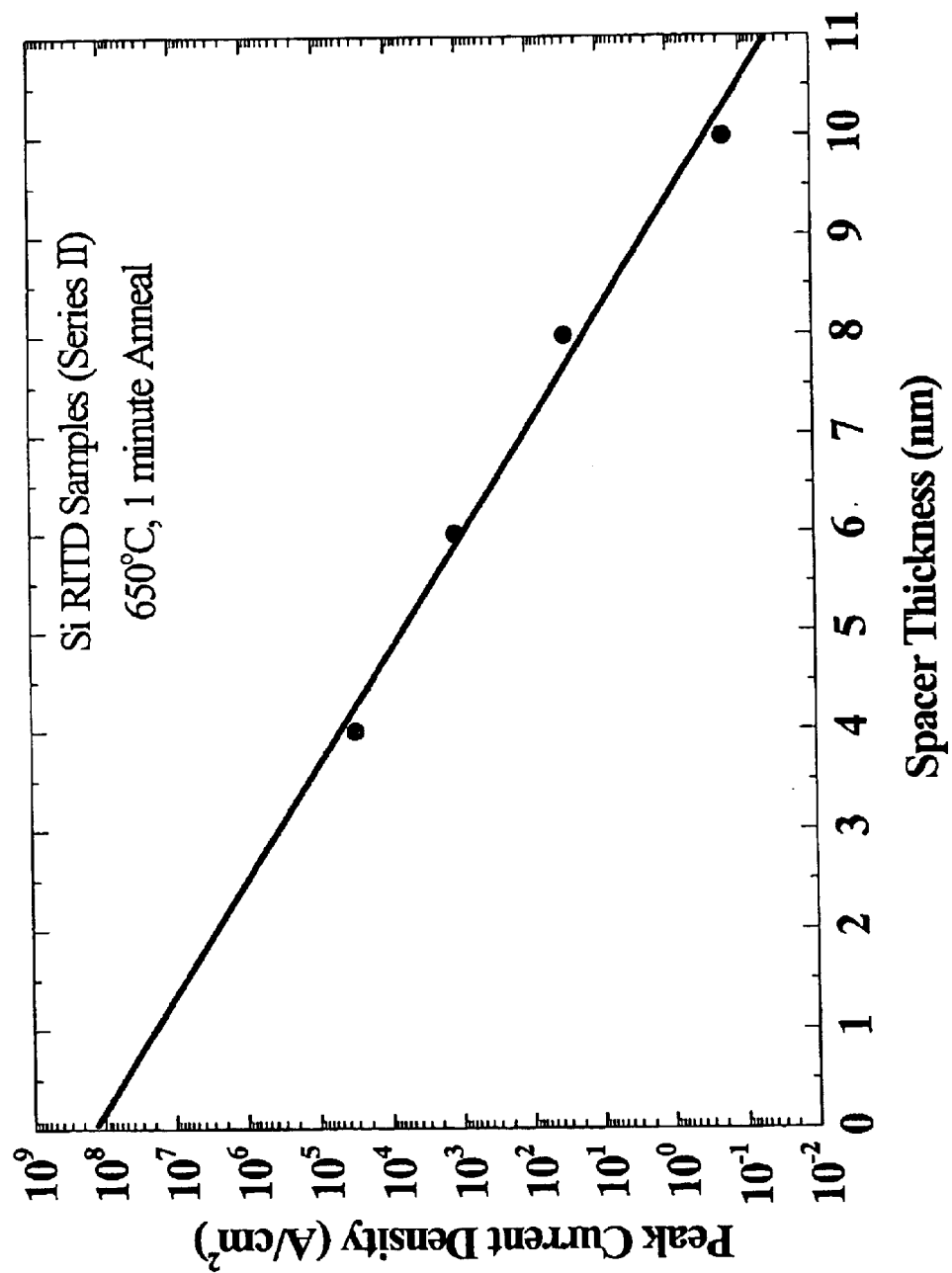
FIG. 17 shows the resulting current density of the structure presented in FIG. 14(a) where the undoped spacer has a thickness of 4, 6, 8, and 10 nm.

In this study, portions of each sample were annealed at 600° C., 650° C., and 700° C. As-grown samples were also fabricated for a comparison. Experimental results show that the optimal anneal condition is close to 650° C., 1 min. As-grown samples show a clear inflection in the forward direction, but no evidence of NDR. The average PVCR observed was found to be 1.60, 2.05, and 1.45 after 1 min. RTA heat treatments of 600, 650, and 700° C., respectively. The peak current density increased with anneal temperature from 570 A/cm$^2$ to 7.3 kA/cm$^2$. FIG. 16 shows the I–V characteristics from this sample annealed at 650° C., 1 min. When the tunnel barrier was increased to 8 nm, the PVCR was again found to be 2.0 for a 650° C., 1 min. anneal, at a much lower current density of 30 A/cm$^2$. A clear scaling in current which spanned four orders of magnitude (40 kA/cm$^2$ to 0.19 kA/cm$^2$) was observed between the 4, 6, 8, and 10 nm samples. FIG. 17 shows a semilog plot of the peak current density vs. spacer thickness for diode annealed at 650° C., 1 min. This illustrates that the tunnel barrier may be dominated by the undoped spacer thickness.

EXAMPLE 7

Figure 18:
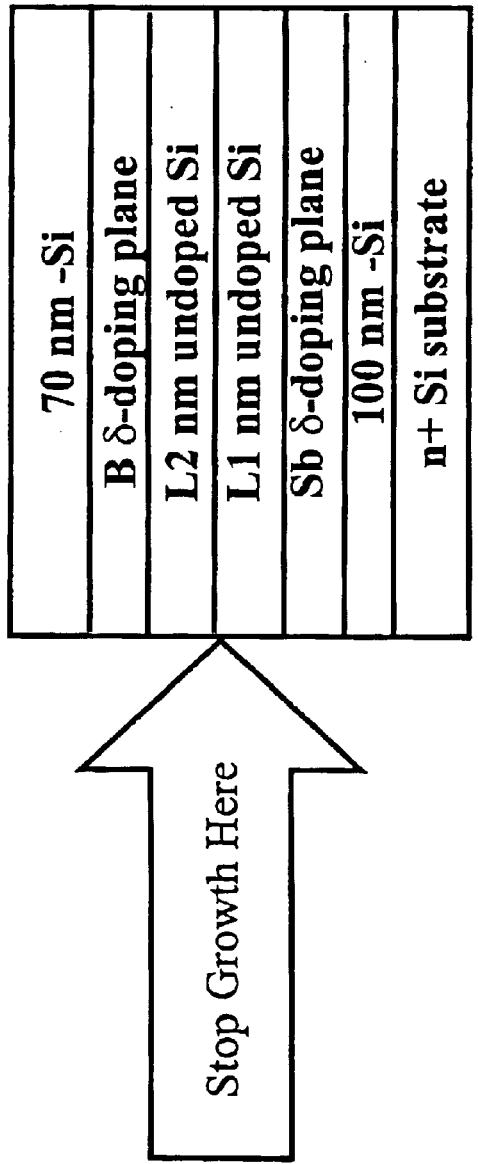
FIG. 18 is a schematic diagram of a tunnel diode in which the tunnel barrier is grown via a multiple stage temperature process. After growing a length L1 at a low growth temperature of 320° C., a stop growth ensues. The temperature is then raised to 550° C. for the remainder of the growth. When the combination of L1/L2 is 5 nm/3 nm, the resulting current-voltage characteristics are shown to be comparable to those of the structure presented in FIG. 14(a).

A schematic cross section of the layer structure is shown in FIG. 18. Si buffer layer growth was initiated at 650° C. and a 10 nm buffer was grown at which point the growth was interrupted for the Sb δ-doping. The temperature was lowered to 320° C. while 3×10$^{14}$ cm$^{-2}$ Sb was deposited. Growth was resumed at 320° C. following Sb deposition and a thickness L1=2 or 5 nm of Si was grown. The growth was again interrupted and the temperature increased to 550° C. at which point growth was resumed and a thickness L2=3, 6 or 9 nm of Si was grown. Growth was then interrupted for B δ-doping and $3\times10^{14}$ cm$^{-2}$ B was deposited. Growth was resumed and an undoped 20 nm Si layer was grown followed by a 50 nm p$^+$ cap doped $1\times10^{20}$ cm$^{-3}$. Portions of each wafer were given a 650° C. 1 min. rapid thermal treatment that, in the past, has been shown to achieve the highest negative differential resistance (NDR).

Figure 19:
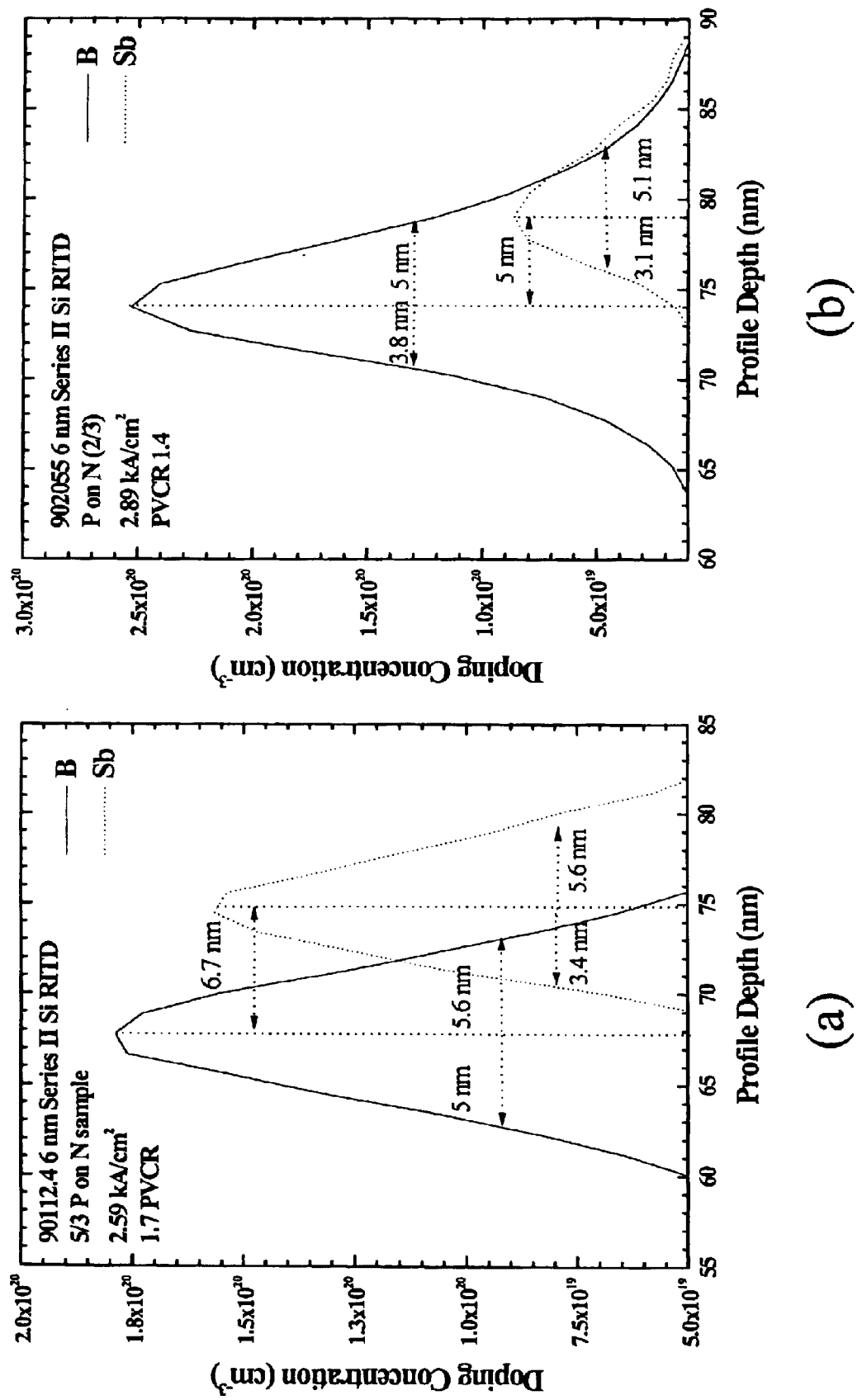
FIG. 19 shows the secondary ion mass spectrometry profiles of the structure shown in FIG. 18 where the L1/L2 spacing is (a) 5 nm/3 nm and (b) 2 nm/3 nm.
Figure 20:
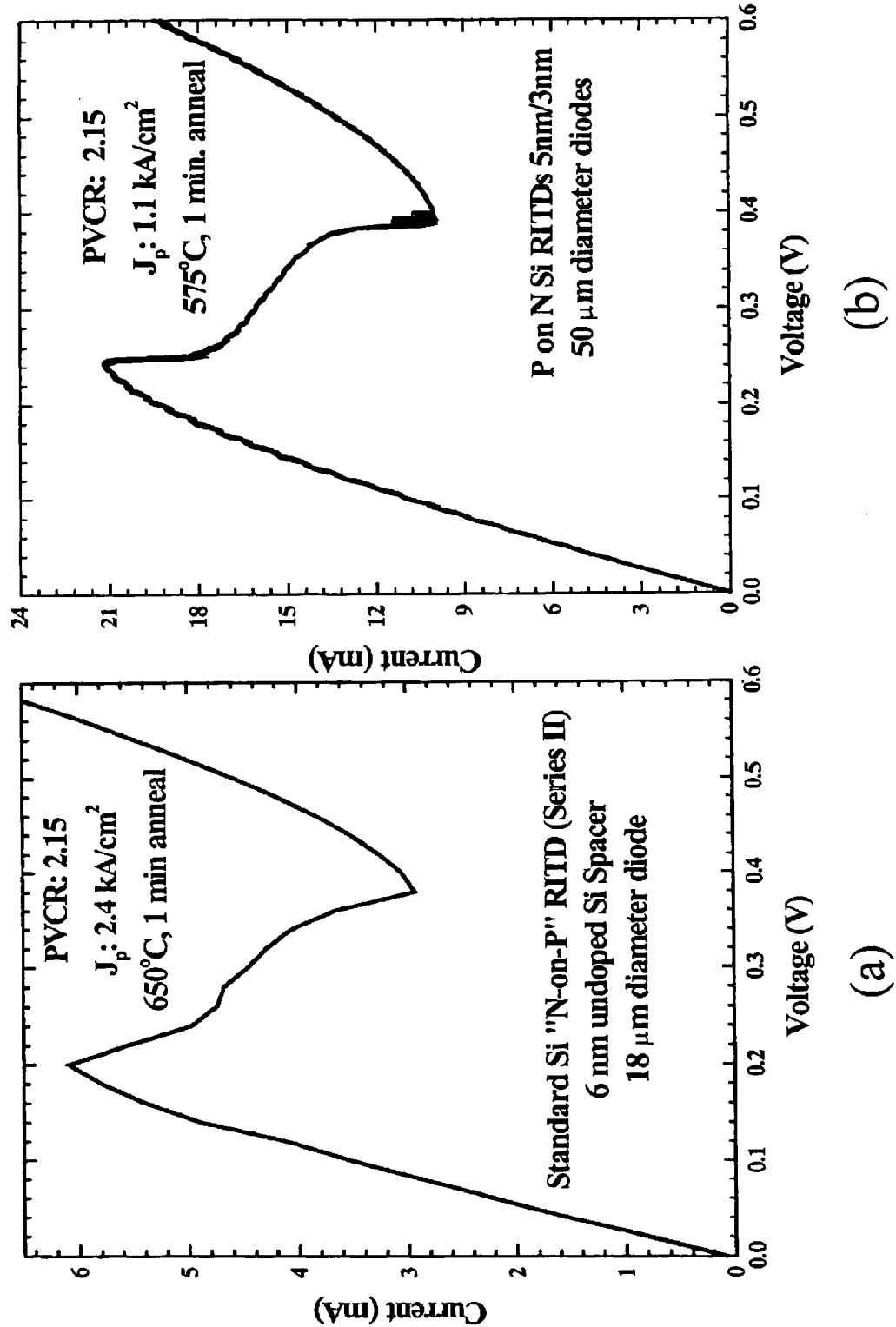
FIG. 20 shows a comparison of the current voltage characteristics of the structure presented in FIG. 14(a) and FIG. 18. The PVCR and current density are comparable.

The strong increase in Sb surface segregation that is obtained by cycling the substrate temperature between 320 and 550° C. provides the same reduction in dopant incorporation and thus doping concentration. FIG. 19 shows a comparison of several SIMS profiles of diode structures to illustrate the efficacy of the thermal cycling approach. The effect of the parameter L1 can be seen by comparing the Sb profiles of two p-on-n tunnel diodes with L1=5 and L2=3 (FIG. 19a) and L1=2 and L2=3 (FIG. 19b). TABLE 3 lists the resulting peak current densities and PVCRs for diodes fabricated with the structure presented in FIG. 18 for L1/L2 combinations of 2 nm/6 nm, 2 nm/3 nm, 5 nm/9 nm, 5 nm/6 nm, and 5 nm/3 nm. TABLE 3 gives the layer parameters and diode characteristics which are discussed below. FIG. 19 and TABLE 3 show that by increasing the parameter L1, the incorporation of Sb increases by approximately a factor of two and approaches the nominal dose ($3\times10^{14}$ cm$^{-2}$). The measured B δ-dose is invariant as expected. FIG. 15 is a typical n-on-p tunnel diode grown by LTE at a growth temperature of 320° C. and is shown to illustrate the improvement in abruptness using the thermal cycling technique described here. It can be seen that the broad tail is eliminated. FIG. 20(b) shows the I–V characteristics of the p-on-n sample annealed at 575° C., 1 min. Note that the resulting PVCR of 2.1 and peak current density of 1.1 kA/cm 2 are comparable to that of the n-on-p 6 nm RITD shown in FIG. 20(a).

EXAMPLE 8

Following the success of the complementary p-on-n growth strategy, it is possible to demonstrate the integration of two tunnel diodes in a single growth. The basic flow and design presented here follow that of III–V RITDs [7], presenting a symmetric pnp RITD structure. The motivation for developing this structure was to mimic the I–V characteristic of III–V RTDs which have NDR regions under forward and reverse bias. A Si-based structure with these properties would facilitate the development of a Goto-type memory cell [8]. Ideally, the PVCR and peak current density of the forward and reverse NDR regions should be nearly identical if the structure grown is symmetrical.

Figure 21:
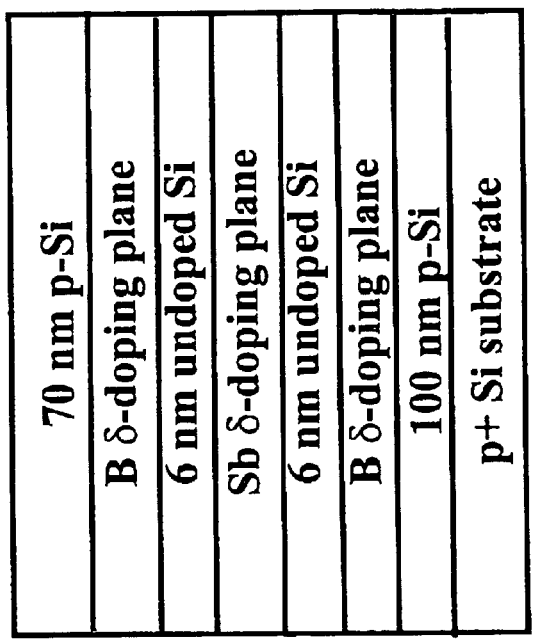
FIG. 21 shows a schematic diagram of a pnp interband tunnel diode with two tunnel barriers which exhibits negative differential resistance in both forward and reverse bias conditions.
Figure 22:
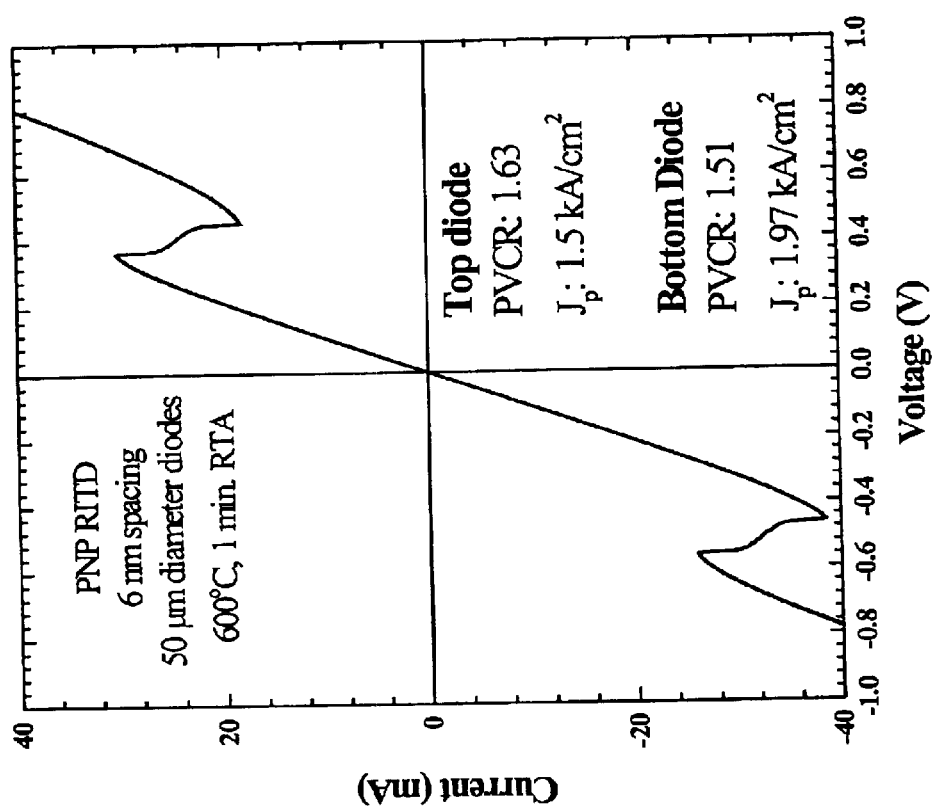
FIG. 22 shows the current voltage characteristics of the structure presented in FIG. 21.

FIG. 21 shows a structure which in essence includes two 6 nm Si RITD layers. FIG. 22 shows the I–V characteristics resulting from a 600° C., 1 min anneal for the pnp RITD. Note that when a forward bias is applied, the device nearer the surface (the top diode) will be under forward bias, and when a reverse bias is applied with respect to the layers, the device nearer the substrate (the bottom diode) will be under forward bias. As theorized, NDR is clearly present in the forward and reverse directions.

Although during the discussion above, several embodiments are compared, all embodiments described above and variations therein are suitable for their intended purpose.

In the drawings and specification, there have been disclosed typical preferred embodiments of the invention and, although specific terms are employed, they are used in a generic and descriptive sense only and not for purposes of limitation, the scope of the invention being set forth in the following claims.

Publications

Publications concerning tunnel diode structures and epitaxial growth are listed as follows, and the disclosure of each of said prior publications is incorporated herein by reference:

1. A. C. Seabaugh, B. Brar, T. Broekaert, G. Frazier, and P. van der Wagt, "Resonant tunneling circuit technology: has it arrived?" *GaAs IC Symposium*, pp. 119–122, 1997.
2. A. Seabaugh, X. Deng, T. Blake, B. Brar, T. Broekaert, R. Lake, F. Morris and G. Frazier, "Transistors and Tunnel Diodes for Analog/Mixed-Signal Circuits and Embedded Memories," 1998*International Electron Devices Meeting Technical Digest*, pp. 429–432, 1998.
3. J. Shen, G. Kramer, and R. Tsui, "Static Random Access Memories based on Resonant Interband Tunnel Diodes in the InAs/GaSb/AlSb system," *IEEE Elec. Dev. Lett.*, pp. 178–180, 1995.
4. J. P. A. van der Wagt, A. C. Seabaugh, and E. Beam, "RTD/HFET Low Standby Power SRAM Gain Cell," 1996*International Electron Devices Meeting Technical Digest*, pp. 425–428, 1996.
5. V. M. Franks, K. F. Hulme, and J. R. Morgan, "An Alloy Process for Making High Current Density Si Tunnel Diode Junctions," *Solid State Electronics*, vol. 8, pp. 343–344, 1965.
6. R. Duschl, O. G. Schmidt, G. Reitemann, E. Kasper, and K. Eberl, "High Room Temperature Peak-to-Valley Current Ratio in Si-Based Esaki Diodes," *Elect. Lett.*, vol. 35, pp. 1111–1112, Jun. 24, 1999.
7. R. Duschl, O. G. Schmidt, and K. Eberl, "Epitaxially grown Si/SiGe interband tunneling diodes with high room-temperature peak-to-valley ratio," *Appl. Phys. Lett.*, vol. 76, pp. 879–881, 2000
8. R. Tsu and L. Esaki, "Tunneling in a Finite Superlattice," *Appl. Phys. Lett.*, vol. 22, pp. 562–564, 1973.
9. L. L. Chang, L. Esaki, and R. Tsu, "Resonant Tunneling in Semiconductor Double Barriers," *Appl. Phys. Lett.*, vol. 24, pp. 593–595, 1974.
10. E. Kasper, H. Dambkes, and J. F. Lu, "Very Low Temperature MBE Process for SiGe and Si Device Structures," 1998 *Int. Elec. Dev. Meeting Tech. Digest*, pp. 558, 1988.
11. U. Gennser, U. P. Kesan, S. S. Iyer, T. J. Bucelot, and E. S. Yang, "Resonant Tunneling of Holes Through Silicon Tunneling Barriers," *J. Vac. Sci. Tech. B*, vol. 8, pp. 219, 1990.
12. K. Ismail, B. S. Meyerson, and P. J. Wang, "Electron Resonant Tunneling in Si/SiGe double barrier diodes," *Appl. Phys. Lett.*, vol. 59, pp. 973–975, 1991.
13. M. Sweeny, and J. Xu, "Resonant Interband Tunnel Diodes," *Appl. Phys. Lett.*, vol. 54, pp. 546–548, 1989.
14. H. H. Tsai, Y. K. Su, H. H. Lin, R. L. Wang, and T. L. Lee, "P-N Double Quantum Well Resonant Interband Tunneling Diode with Peak-to-Valley Current Ratio of 144 at Room Temperature," *IEEE Elec. Dev. Lett.*, vol. 15, pp. 357–359, 1994.
15. D. J. Day, R. Q. Yang, J. Lu, and J. M. Xu, "Experimental Demonstration of resonant interband tunnel diode with room temperature peak-to-valley current ratios over 100," *J. Appl. Phys.*, vol. 68, pp. 1542–1544, 1993.
16. C. C. Yang, K. C. Huang, Y. K. Su, and R. L. Wang, "The study of GaAs/InGaAs δ-doping resonant interband tunnel diodes," Mat. Sci. and Eng. B., pp. 259–262, 1995.
17. H. J. Gossman and E. F. Schubert, "Delta Doping in Silicon," *Crit. Rev. in Solid State and Mater. Sci.*, vol. 18, pp. 1–67, 1993.
18. G. E. Becker, and J. C. Bean, "Acceptor Dopants in Silicon Molecular Beam Epitaxy," *J. Appl. Phys.*, vol. 48, pp. 3395, 1977.
19. J. Knall, J. Sundgren, J. Greene, A. Rockett, and S. Barnett, "Indium Incorporation During the Growth of (100) Si by Molecular Beam Epitaxy: Surface Segregation and Reconstruction," *Appl. Phys. Lett.*, vol. 45, pp. 689, 1984.

20. T. E. Jackman, D. C. Houghton, J. A. Jackman, M. W. Denhoff, S. Kechang, J. McCaffrey, and A. Rockett, "Annealing Studies of Highly Doped Boron Superlattices," *J. Appl. Phys.*, vol. 66, pp. 1984–1992, 1989.
21. S. A. Barnett and J. E. Greene, "Si Molecular Beam Epitaxy: A Model for Temperature Dependent Incorporation Probabilities and Depth Distributions of Dopants Exhibiting Strong Surface Segregation," *Surface Science*, vol. 151, p. 67, 1985.
22. E. F. Schubert, "Introduction," *Delta-doping of Semiconductors.*, Cambridge Univ. Press, Cambridge, U.K., pp. 3–19, 1996.
23. I. Eisele, "Solid Phase Epitaxy for delta-doping in silicon," *Delta-doning of Semiconductors.*, Cambridge Univ. Press, Cambridge, U.K., pp. 137–160, 1996.
24. K. D. Hobart, D. J. Godbey, M. E. Twigg, M. Fatemi, P. E. Thompson, D. S. Simons, "Surface Segregation and Structure of Sb Doped Si (100) Films Grown at Low Temperature By Molecular Beam Epitaxy," *Surface Sci.*, vol. 334, pp. 29–35, 1995.
25. K. D. Hobart, F. J. Kub, G. G. Jernigan and P. E. Thompson, "Surface segregation of arsenic and phosphorus from buried layers during Si molecular beam epitaxy," *J. Vac. Sci. Technol. B*, vol. 14, pp. 2229–2232 (1996).
26. S. S. Iyer, R. A. Metzger, and F. G. Allen, "Sharp profiles with high and low doping levels in silicon grown by molecular beam epitaxy," *J. Appl. Phys.* Vol. 52, pp. 5608–5613 (1981).
27. J. -P. Noël, J. E. Greene, N. L. Rowell and D.C. Houghton, "Photoluminescence studies of Si (100) doped with low-energy (100–1000 eV) B+ ions during molecular beam epitaxy," *Appl. Phys. Lett.* vol., 56, pp. 265–267 (1990).
28. K. D. Hobart, D. J. Godbey, P. E. Thompson, D. S. Simons, "Sb surface segregation during heavy doping of Si(100) grown at low temperature by molecular beam epitaxy," *J. Vac. Sci. Technol. B*, vol. 11, pp. 1115–1119 (1993).
29. S. Fukatsu, K. Fujita, H. Yaguchi, Y. Shiraki and R. Ito, "Self-limitation in the surface segregation of Ge atoms during Si molecular beam epitaxial growth," *Appl. Phys. Lett.* vol. 59, pp. 2103–2105 (1991).
30. Y. Shiraki, "Silicon Molecular Beam Deposition," *The Technology and Physics of Molecular Beam Epitaxy*, Plenum Press, NY, pp. 345–386, 1985.
31. D. J. Eaglesham, H. J. Gossman, and M. Cerullo, "Limiting Thickness $h_{epi}$ for Epitaxial Growth and Room Temperature Si Growth on Si (100)," *Phys. Rev. Lett.*, vol. 65, pp. 1227–1230, 1990.
32. P. R. Berger, P. K. Bhattacharya, and J. Singh, "A Comparative Study of the Growth processes of GaAs, AlGaAs, InGaAs and InAlAs Lattice Matched and Non-lattice Matched Semiconductors Using High Energy Electron Diffraction," *J. Appl. Phys.*, vol. 61, pp. 2856–2860, 1987.
33. P. R. Berger, K. Chang, P. Bhattacharya, and J. Singh, "Role of Strain and Growth Conditions on the Growth Front Profile of $In_xGa_{1-x}As$ on GaAs During the Pseudomorphic Growth Regime," *Appl. Phys. Lett.*, vol. 53, pp. 684–686, 1988.
34. H. J. Gossmann, and F. C. Unterwald, "Dopant Electrical Activity in Majority Carrier Mobility in B Delta Doped and Sb Delta Doped Thin Films," *Phys. Rev.*, vol. B47, pp. 8237–8241, 1993.
35. G. Masetti, M. Severi, and S. Salmi, "Modeling of Carrier Mobility Against Carrier Concentration in Arsenic Doped, Phosphorus Doped, and B Doped Silicon," *IEEE Trans. Elec. Dev.*, vol. ED-30, p. 764–769, 1983.
36. P. Asoka-Kumar, T. C. Gossmann, F. C. Unterwald, L. C. Feldmann, T. C. Leung, H. L. Au, V. Talyanski, B. Nielson, and K. G. Lynn, *Phys. Rev. B*, vol. B48, pp. 5345, 1993.
37. H. Jorke, H. Kibbel, K. Strohm, and E. Kasper, "Forward-Bias Characteristics of Si Bipolar Junctions Grown by Molecular Beam Epitaxy at Low Temperatures," *Appl. Phys. Lett.*, vol. 63, pp. 2408–2410, 1993.
38. G. Reitmann, E. Kasper, H. Kibbel, and H. Jorke, "Tunneling Currents in Very Narrow P+-N+ Junctions," *Thin Solid Films*, vol. 336, pp. 344–346 (1998).
39. K. Morita, K. Morimoto, H. Sorada, K. Araki, K. Yuki, M. Niwa, T. Uenoyama, and K. Ohnaka, "Si Interband Tunnel Diode through a Thin Oxide with a Degenerate poly-Si Electrode," 1997 *International Workshop on Quantum Function Devices*, pp. 175–176, 1997.
40. K. Morita, H. Sorada, K. Morimoto, K. Yuki, S. Yoshi, M. Niwa, T. Uenoyama, and K. Ohnaka, "High Performance CMOS Compatible Bistable Operation at Extremely Low Supply Voltage by a Novel Si Interband Tunneling Diode," 1998 *DRC Proceedings*, pp. 42–43, 1998.
41. X. G. Zhu, X. Y. Zheng, M. Pak, M. O. Tanner, K. L. Wang, "A Si bistable diode utilizing interband tunneling junctions," *Appl. Phys. Lett.*, vol. 71, pp. 2190–2192, 1997.
42. X. Zhu, X. Zheng, M. Pak, M. O. Tanner, K. L. Wang, "Bistable diodes grown by silicon molecular beam epitaxy," *Thin Solid Films*, vol. 321, pp. 201–205, 1998.
43. Sean L. Rommel, T. E. Dillon III, M. W. Dashiell, H. Feng, J. Kolodzey, Paul R. Berger, Phillip E. Thompson, K. D. Hobart, Roger Lake, and Alan Seabaugh, "Demonstration of Room Temperature NDR in $Si_{0.5}Geo_{0.5}$/Si Heterojunction Interband Tunneling Diodes Using Delta-doped Si Injectors," *Late News at* 1998 *IEEE Silicon Nanoelectronics Workshop in Honolulu, HI.* (Jun. 7–8, 1998).
44. Sean L. Rommel, Thomas E. Dillon, M. W. Dashiell, H. Feng, J. Kolodzey, Paul R. Berger, Phillip E. Thompson, Karl D. Hobart, Roger Lake, Alan C. Seabaugh, Gerhard Klimeck, and Daniel K. Blanks, "Room Temperature Operation of Epitaxially Grown Si/$Si_{0.5}Ge_{0.5}$/Si Resonant Interband Tunneling Diodes," *Appl. Phys. Lett.*, vol. 73, pp. 2191–2193 (Oct. 12, 1998).
45. Sean L. Rommel, Thomas E. Dillon, Paul R. Berger, Roger Lake, Phillip E. Thompson, Karl D. Hobart, Alan C. Seabaugh, and David S. Simons, "Si-Based Interband Tunneling Devices For High-Speed Logic and Low Power Memory Applications," *Late News in the* 1998 *International Electron Devices Meeting Technical Digest*, pp. 1035–1037 (Dec. 8, 1998).
46. Sean L. Rommel, Thomas E. Dillon, Paul R. Berger, Phillip E. Thompson, Karl D. Hobart, Roger Lake, and Alan C. Seabaugh, "Epitaxially Grown Si Resonant Interband Tunnel Diodes Exhibiting High Current Densities," *IEEE Elect. Dev. Lett.*, vol. 20, pp. 329–331 (July 1999).
47. Phillip E. Thompson, Karl D. Hobart, Mark Twigg, Glenn Jernigan, Thomas E. Dillon, Sean L. Rommel, Paul R. Berger, David S. Simons, Peter H. Chi, Roger Lake and Alan C. Seabaugh, "Si Resonant Interband Tunnel Diodes Grown by Low Temperature Molecular Beam Epitaxy," *Appl. Phys. Lett.*, vol. 75, pp. 1308–1310 (Aug. 30, 1999).
48. M. W. Dashiell, R. T. Troeger, S. L. Rommel, T. N. Adam, P. R. Berger, J. Kolodzey, A. C. Seabaugh and R.

Lake, "Current Voltage Characteristics of High Current Density Silicon Esaki Diodes Grown by Molecular Beam Epitaxy and the Influence of Thermal Annealing," *submitted to IEEE Trans. on Elect. Devl. (Dec. 1, 1999)*.

49. Paul R. Berger, "Current Status of Si-based Tunnel Diodes," *SRC's Si Tunnel Diode and CMOS/HBT Integration Workshop*, Washington, D.C. (1999).

50. Phillip E. Thompson, Karl D. Hobart, Sean L. Rommel, Paul R. Berger, Roger Lake, Alan Seabaugh, Peter H. Chi, and David S. Simons, "Epitaxial Si-Based Tunnel Diodes," *to be presented at the European Materials Research Society Spring Meeting*, Staasbourg, France (2000).

51. Sean L. Rommel, N. Jin, T. E. Dillon, S. J. DiGiacomo, J. Banyai, B. M. Cord, A. D'Imperio, D. J. Hancock, N. Kirpalani, V. Emanuele, P. R. Berger, P. E. Thompson, K. D. Hobart and R. Lake, "Development of Delta-B/I-Si/Delta-Sb and Delta-B/I-Si/Delta-Sb/I-Si/Delta-B Resonant Interband Tunnel Diodes for Integrated Circuit Application," *to be presented at the at the 2000 Device Research Conference*, at Denver University, Denver, Colo., Jun. 19–21, 2000.

52. K. D. Hobart, P. E. Thompson, S. L. Rommel, T. E. Dillon, and P. R. Berger, "A P-on-N Si Interband Tunnel Diode Grown by Molecular Beam Epitaxy," submitted to *J. Vac. Sci. and Technol. B* (May 2000).

53. P. R. Berger, P. K. Bhattacharya, and J. Singh, "A Comparative Study of the Growth processes of GaAs, AlGaAs, InGaAs and InAlAs Lattice Matched and Non-lattice Matched Semiconductors Using High Energy Electron Diffraction," *J. Appl. Phys.*, vol. 61, pp. 2856–2860, (1987).

54. F-Y. Juang, P. K. Bhattacharya, and J. Singh, "Determination of the microscopic quality of InGaAs—InAlAs interfaces by photoluminescence—Role of interrupted molecular beam epitaxial growth, *Appl. Phys. Lett.*, vol. 48, pp. 290–292 (1986).

55. N. Larsen, P. Kringhøj, "Diffusion of Sb in Relaxed $Si_{1-x}Ge_x$," *Appl. Phys. Lett.*, vol. 68, pp. 2684–2686 (1996).

56. P. Kringhøj, A. N. Larsen, and S. Y. Shirayev, "Diffuision of Sb in Strained and Relaxed Si and SiGe," *Phys. Rev. Lett.*, vol. 76, pp. 3372–3375 (1996).

57. P. Kuo, J. L. Hoyt, J. F. Gibbons, J. E. Turner, and D. Lefforge, "Effects of strain on boron diffusion in Si and $Si_{1-x}Ge_x$," *Appl. Phys. Lett., vol.* 66, pp. 580–582 (1995).

58W. Gao, P. R. Berger, G. J. Zydzik, H. M. O'Bryan, D. L. Sivco, and A. Y. Cho, "$In_{0.53}Ga_{0.47}As$ MSM Photodiodes with Transparent CTO Schottky Contacts and Digital Superlattice Grading," *IEEE Trans. Elec. Dev.*, vol. 44, pp. 2174–2178, 1997.

59. E. Wolak, K. L. Lear, P. M. Pinter, E. Sittellman, B. G. Park. T. Well, J. S. Harris, and D. Thomas, "Elastic Scattering Centers in Resonant Tunneling Diodes," *Appl. Phys. Lett.*, vol. 53, pp. 201–3, 1988.

TABLE 1

| Sample Number | Diode Diameter (μm) | Peak Voltage (V) 700/800° C. | Peak Current Density (A/cm²) 700/800° C. | PVCR 700/800° C. |
|---|---|---|---|---|
| RITD (TD1) | 18 | 0.35/0.12 | 2150/220 | 1.21/1.04 |
| | 50 | 0.55/0.25 | 1720/180 | 1.18/1.04 |
| | 75 | 0.68/0.36 | 1490/470 | 1.11/1.35 |
| RITD (TD2) | 18 | 0.34/0.16 | 3230/520 | 1.54/1.18 |
| | 50 | 0.87/0.38 | 2870/430 | 1.52/1.26 |
| | 75 | 1.21/0.52 | 2690/470 | 1.48/1.30 |

TABLE 2

| | | 1 minute anneal | | | | |
|---|---|---|---|---|---|---|
| | | 500 C | 550 C | 600 C | 650 C | 700 C |
| SiTD1 | Jp (A/cm2) | 1603 | 605 | 1360 | 872 | 172 |
| 4 nm i-Si | Jv (A/cm2) | B/w | 523 | 982 | 648 | 149 |
| | PVCR | Diode | 1.15 | 1.38 | 1.35 | 1.15 |
| SiTD2 | Jp (A/cm2) | 32000 | 15800 | 9400 | 1400 | 459 |
| 2 nm i-Si | Jv (A/cm2) | 27000 | 14820 | 6500 | 1280 | 408 |
| | PVCR | 1.17 | 1.066 | 1.45 | 1.09 | 1.12 |

NDR was observed without an anneal for SiTD1 (PVCR 1.08, $J_p$ = 3.93 kA/cm²)

TABLE 3

Table of "P on N" RITD Results
650° C., 1 min anneal

| Layer | $L_{before}$ | $L_{after}$ | $J_p$ | PVCR |
|---|---|---|---|---|
| 90205.6 | 2 nm | 6 nm | 115 A/cm² | 1.2 |
| 90205.5 | 2 nm | 3 nm | 2.98 kA/cm² | 1.3 |
| 90112.4 | 5 nm | 3 nm | 2.59 kA/cm² | 1.7 |
| 90112.5 | 5 nm | 6 nm | 19 A/cm² | 1.2 |
| 90112.6 | 5 nm | 9 nm | 12.7 A/cm² | no PVCR-inflection |

$L_{before}$ refers to the length grown prior to the stop growth.
$L_{after}$ refers to the length after the stop growth.

What is claimed is:

1. An interband tunnel diode, comprising:
   a bottom injector layer;
   a bottom spacer;
   a top spacer;
   a top injector layer is separated by an offset from the bottom injector, the bottom injector and top injector layers forming the ends of a p-i-n junction; and
   a material inserted between the bottom injector and top injector which serves as a tunnel barrier, and where i in the p-i-n junction represents at least one material provided between the bottom and top injectors.

2. The interband tunnel diode as recited in claim 1, wherein the layers in the interband tunnel diode are a semiconductor or insulator.

3. The interband tunnel diode as recited in claim 1, wherein the layers in the interband tunnel diode are a Si compatible material.

4. The interband tunnel diode as recited in claim 1, wherein the layers in the interband tunnel diode are comprised of a Group IV alloy.

5. The interband tunnel diode as recited in claim 1, wherein the layers in the interband tunnel diode are comprised of, but not limited to, Si, Ge, C, Sn, $Si_{1-x}$, $C_x$, $Si_{1-x}Sn_x$, $Si_{1-x-y}Ge_xC_y$, $Si_{1-x-y-z}Ge_xC_ySn_z$, $Si_{1-x}O_x$, $Si_{1-x}N_x$, $Al_{1-x}O_x$, or combinations thereof.

6. The interband tunnel diode as recited in claim 1, wherein the tunnel barrier material is doped below $10^{17}$ cm$^{-3}$.

7. The interband tunnel diode as recited in claim 1, wherein the tunnel barrier is less than or equal to 50 nm thick.

8. The interband tunnel diode as recited in claim 1, wherein the tunnel barrier is less than or equal to 10 nm thick.

9. The interband tunnel diode as recited in claim 1, wherein the doping concentrations of the top and bottom injector layers are between $1\times10^{15}$ cm$^{-3}$ and $5\times10^{22}$ cm$^{-3}$, and not necessarily equal.

10. The interband tunnel diode as recited in claim 1, wherein the top and bottom spacer layers are doped below $10^{17}$ cm$^{-3}$, and not necessarily equal.

11. The interband tunnel diode as recited in claim 1, wherein the thickness of the top and bottom spacer layers are between 0 and 50 nm, and not necessarily equal.

12. The interband tunnel diode as recited in claim 1, wherein the thickness of the top and bottom spacer layers are between 0 and 10 nm, and not necessarily equal.

13. An interband tunnel diode, comprising:
a bottom injector layer;
a bottom spacer;
a top spacer;
a top injector, the bottom injector and top injector layers forming the ends of a p-i-n junction;
a material inserted between the bottom injector and the top injector which serves as a tunnel barrier; and
wherein a first quantum well is formed in direct contact with the bottom injector layer and is also in direct contact with, or separated by an offset from the tunnel barrier, and where i in the p-i-n junction represents at least one material provided between the bottom and top injectors.

14. The interband tunnel diode as recited in claim 13, wherein the quantum well is formed by an energy band offset at, or near, a heterojunction.

15. The interband tunnel diode as recited in claim 13, wherein the quantum well is formed by a highly doped layer.

16. The interband tunnel diode as recited in claim 13, wherein the quantum well is formed by a δ-doped layer.

17. The interband tunnel diode as recited in claim 16, wherein the quantum well is doped above $10^{12}$ cm$^{-2}$.

18. The interband tunnel diode as recited in claim 16, wherein the quantum well is doped above $10^{13}$ cm$^{-2}$.

19. The interband tunnel diode as recited in claim 16, wherein the quantum well material is less than or equal to 10 nm thick.

20. The interband tunnel diode as recited in claim 16, wherein the quantum well material is less than or equal to 2.5 nm thick.

21. The interband tunnel diode as recited in claim 13, wherein the quantum well leads to a resonant tunneling between said quantum well and the opposite polarity injector layer.

22. The interband tunnel diode as recited in claim 13, wherein the layers in the interband tunnel diode are a semiconductor or insulator.

23. The interband tunnel diode as recited in claim 13, wherein the layers in the interband tunnel diode are a Si compatible material.

24. The interband tunnel diode as recited in claim 13, wherein the layers in the interband tunnel diode are comprised of a Group IV alloy.

25. The interband tunnel diode as recited in claim 13, wherein the layers in the interband tunnel diode are comprised of, but not limited to, Si, Ge, C, Sn, $Si_{1-x}C_x$, $Si_{1-x}Sn_x$, $Si_{1-x-y}Ge_xC_y$, $Si_{1-x-y-z}Ge_xC_ySn_z$, $Si_{1-x}O_x$, $Si_{1-x}N_x$, $Al_{1-x}O_x$, or combinations thereof.

26. The interband tunnel diode as recited in claim 13, wherein the tunnel barrier material is doped below $10^{17}$ cm$^{-3}$.

27. The interband tunnel diode as recited in claim 13, wherein the tunnel barrier is less than or equal to 50 nm thick.

28. The interband tunnel diode as recited in claim 13, wherein the tunnel barrier is less than or equal to 10 nm thick.

29. The interband tunnel diode as recited in claim 13, wherein the doping concentrations of the top and bottom injector layers are between $1\times10^{15}$ cm$^{-3}$ and $5\times10^{22}$ cm$^{-3}$, and not necessarily equal.

30. The interband tunnel diode as recited in claim 13, wherein the top and bottom spacer layers are doped below $10^{17}$ cm$^{-3}$, and not necessarily equal.

31. The interband tunnel diode as recited in claim 13, wherein the thickness of the top and bottom spacer layers are between 0 and 50 nm, and not necessarily equal.

32. The interband tunnel diode as recited in claim 13, wherein the thickness of the top and bottom spacer layers are between 0 and 10 nm, and not necessarily equal.

33. An interband tunnel diode, comprising:
a bottom injector layer;
a bottom spacer;
a top spacer;
a top injector layer, the bottom injector and top injector layers forming the ends of a p-i-n junction;
a material inserted between the bottom injector and top injector which serves as a tunnel barrier;
wherein a first quantum well is formed in direct contact with the bottom injector layer and is also in direct contact with, or separated by an offset from the tunnel barrier; and
wherein a second quantum well is in direct contact with the top injector layer and is also in direct contact with, or separated by an offset from the tunnel barrier, and where i in the p-i-n junction represents at least one material provided between the bottom and top injectors.

34. The interband tunnel diode as recited in claim 33, wherein the first and second quantum wells are formed by an energy band offset at, or near, a heterojunction.

35. The interband tunnel diode as recited in claim 33, wherein the first and second quantum wells are formed by a highly doped layer.

36. The interband tunnel diode as recited in claim 33, wherein the first and second quantum wells are formed by a δ-doped layer.

37. The interband tunnel diode as recited in claim 36, wherein the first and second quantum wells are doped above $10^{12}$ cm$^{-2}$, and not necessarily equal.

38. The interband tunnel diode as recited in claim 36, wherein the first and second quantum wells are doped above $10^{13}$ cm$^{-2}$, and not necessarily equal.

39. The interband tunnel diode as recited in claim 36, wherein the first and second quantum well material is less than or equal to 10 nm thick, and not necessarily equal.

40. The interband tunnel diode as recited in claim 36, wherein the first and second quantum well material is less than or equal to 2.5 nm thick, and not necessarily equal.

41. The interband tunnel diode as recited in claim 33, wherein the first and second quantum wells lead to a resonant tunneling between said quantum wells.

42. The interband tunnel diode as recited in claim 33, wherein the tunnel barrier is formed between the bottom and top injector layers, wherein the first and second quantum wells are formed adjacent to the tunnel barrier.

43. The interband tunnel diode as recited in claim 33, wherein the layers in the interband tunnel diode are a semiconductor or insulator.

44. The interband tunnel diode as recited in claim 33, wherein the layers in th e interband tunnel diode are a Si compatible material.

45. The interband tunnel diode as recited in claim 33, wherein the layers in the interband tunnel diode are comprised of a Group IV alloy.

46. The interband tunnel diode as recited in claim 33, wherein the layers in the interband tunnel diode are comprised of, but not limited to, Si, Ge, C, Sn, $Si_{1-x}C_x$, $Si_{1-x}Sn_x$, $Si_{1-x-y}Ge_xC_y$, $Si_{1-x-y-z}Ge_xC_ySn_z$, $Si_{1-x}O_x$, $Si_{1-x}N_x$, $Al_{1-x}O_x$, or combinations thereof.

47. The interband tunnel diode as recited in claim 33, wherein the tunnel barrier material is doped below $10^{17}$ $cm^{-3}$.

48. The interband tunnel diode as recited in claim 33, wherein the tunnel barrier is less than or equal to 50 nm thick.

49. The interband tunnel diode as recited in claim 33, wherein the tunnel barrier is less than or equal to 10 nm thick.

50. The interband tunnel diode as recited in claim 33, wherein the doping concentrations of the top and bottom injector layers are between $1 \times 10^{15}$ $cm^{-3}$ and $5 \times 10^{22}$ $cm^{-3}$, and not necessarily equal.

51. The interband tunnel diode as recited in claims 33, wherein the top and bottom spacer layers are doped below $10^{17}$ $cm^{-3}$, and not necessarily equal.

52. The interband tunnel diode as recited in claim 33, wherein the thickness of the top and bottom spacer layers are between 0 and 50 nm, and may not necessarily equal.

53. The interband tunnel diode as recited in claim 33, wherein the thickness of the top and bottom spacer layers are between 0 and 10 nm, and not necessarily equal.

* * * * *